United States Patent [19]

Akiyama et al.

[11] Patent Number: 5,292,672
[45] Date of Patent: Mar. 8, 1994

[54] METHOD OF MANUFACTURING AN INSULATED GATE BIPOLAR TRANSISTOR

[75] Inventors: Hajime Akiyama; Hisao Kondoh, both of Hyogo, Japan

[73] Assignee: Mitsubishi Denki Kabushiki Kaisha, Tokyo, Japan

[21] Appl. No.: 862,604

[22] Filed: Apr. 1, 1992

Related U.S. Application Data

[62] Division of Ser. No. 543,532, Jun. 26, 1990, Pat. No. 5,182,626.

[30] Foreign Application Priority Data

Sep. 20, 1989 [JP] Japan .................. 1-245914

[51] Int. Cl.$^5$ .................................. H01L 21/265
[52] U.S. Cl. ........................... 437/31; 437/24; 437/41; 437/18
[58] Field of Search ............. 437/31, 24, 41, 45, 437/18, 29; 357/23.4, 38, 39

[56] References Cited

U.S. PATENT DOCUMENTS

| | | | |
|---|---|---|---|
| 3,756,862 | 9/1973 | Ahn et al. | 437/24 |
| 3,982,967 | 9/1976 | Ku et al. | 437/24 |
| 4,587,713 | 5/1986 | Goodman et al. | 357/23.4 |
| 4,760,431 | 7/1988 | Nakagawa et al. | 357/23.4 |
| 4,806,497 | 2/1989 | Adam et al. | 437/24 |
| 5,023,696 | 6/1991 | Ogino | 357/39 |
| 5,034,336 | 7/1991 | Seki | 437/31 |
| 5,075,751 | 12/1991 | Tomii et al. | 357/38 |
| 5,084,401 | 1/1992 | Hagino | 437/41 |

FOREIGN PATENT DOCUMENTS

| | | | |
|---|---|---|---|
| 327316A | 8/1989 | European Pat. Off. | 357/23.4 |
| 3733100A | 4/1988 | Fed. Rep. of Germany | 357/38 |
| 62-76556 | 4/1987 | Japan | 357/38 |
| 63-205957 | 8/1988 | Japan | 357/38 |
| 63-205958 | 8/1988 | Japan | 357/38 |
| 180077 | 3/1989 | Japan | 357/23.4 |

OTHER PUBLICATIONS

Localized Lifetime Control In Insulated-Gate Transistors By Proton Implantation, IEEE Transaction on Electron Devices, Nov. 1986, vol. ED-33, No. 11, pp. 1667–1671.
Comparison Of Neutron And Electron Irradiation For Controlling IGT Switching Speed, IEEE Transaction on Electron Devices, Sep. 1985, vol. ED-32, No. 9, pp. 1629–1632.
Proton Implantation For Silicon Power Devices, Proceedings of 1988 International Symposium on Power Semiconductor Devices, Tokyo, pp. 147–152.

*Primary Examiner*—Brian E. Hearn
*Assistant Examiner*—Tuan Nguyen
*Attorney, Agent, or Firm*—Oblon, Spivak, McClelland, Maier & Neustadt

[57] ABSTRACT

In the present invention, baneful influences such as the reduction of the threshold voltage due to the irradiation of an ionizing radiation such as an electron beam and a light ion beam are removed to practice the lifetime control of an IGBT with good controllability. Basically, the lifetime control without change in the threshold voltage is implemented by increasing the threshold voltage on or before irradiating the ionizing radiation so as to cancel the influence of each other. Further, the lifetime control without change in the threshold voltage is implemented with higher accuracy by irradiating a light ion beam from a rear main electrode side so as to cause crystal defects locally in a specific region in an epitaxial layer.

6 Claims, 19 Drawing Sheets

METHOD OF MANUFACTURING AN INSULATED GATE BIPOLAR TRANSISTOR

This is a division, of application Ser. No. 07/543,532, filed on Jun. 26, 1990, now U.S. Pat. No. 5,182,626.

BACKGROUND OF THE INVENTION

1. Field of the Invention

The present invention relates to an insulated gate bipolar transistor (referred to as "IGBT" hereinafter) and, more particularly, it relates to a prevention against latch-up of a parasitic thyristor, a control of change in threshold voltage in controlling the lifetime thereof and an improvement of the trade-off relations between the turn-off time and the ON-state resistance.

2. Description of the Background Art

Generally, an- IGBT device has a plurality of IGBT devices (referred to as "IGBT cell" hereinafter) connected in parallel. FIG. 1 is a sectional view showing a constitution of a conventional n channel IGBT cell, and FIG. 2 is a circuit diagram showing an equivalent circuit thereof.

In FIG. 1, a P+ collector layer 1 is formed of a P+ semiconductor substrate. An N+ epitaxial layer 2A is formed on one of major surfaces of the P+ collector layer, and an N− epitaxial layer 2B is formed on the N+ epitaxial layer 2A. The N+ epitaxial layer 2A is formed to make the IGBT keep a specific withstand voltage. P-type impurity is selectively diffused in a part of the surface of the N+ epitaxial layer 2B to form a P well region 3, and N-type impurity of high concentration is selectively diffused in a part of the surface of the P well region 3 to form an N+ emitter region 4. A gate insulating film 5 is formed on the surface of the P well region 3 between the surface of the N− epitaxial layer 2B and the surface of the N+ emitter region 4, and the gate insulating film 5 is also formed on the surface of the N− epitaxial layer 2B so that it is continuous between adjacent IGBT cells. A gate electrode 6 made of polysilicon, for example, is formed on the gate insulating film 5, and an emitter electrode 7 made of metal such as aluminum is formed electrically connecting to both the P base region 3 and the N+ emitter region 4. The gate electrode 6 and the emitter electrode 7 make a multi-layered configuration with an insulating film 8 intervening therebetween, so as to electrically connect to all IGBT cells commonly. A collector electrode 9 made of metal is formed on the bottom face of the P+ collector layer 1 as a single electrode for all the IGBT cells in common.

An area near the surface of the P well region 3 between the N− epitaxial layer 2B and the N+ emitter region 4 has a MOS structure of an n channel, and the application of positive voltage to the gate electrode 6 through a gate terminal G causes electrons to flow from the N+ emitter region 4 to the N− epitaxial layer 2B and the N+ epitaxial layer 2A (these epitaxial layers are referred to as "N base layer 2" en bloc hereinafter) through a channel formed near the surface of the P well region 3 just under the gate electrode 6. Symbol $I_e$ shows electron current flowing in this way. On the other hand, holes which are minority carriers are injected from the P+ collector layer 1 to the N base layer 2. A part of the holes re-combines with the electrons and vanishes, and other part of them flows in the P well region 3 as hole current $I_h$. As will be recognized, the IGBT works basically as a bipolar transistor and its N epitaxial layer 2B increases in its conductivity due to the effect of conductivity modulation, so that the IGBT, can advantageously implement the lower ON voltage and the larger current capacity compared with those of a conventional power MOS.

However, the IGBT is not without the disadvantage that it can not increase in the operating frequency because the hole current $I_h$ slowly reduces while the IGBT is turned off. Then, an electron beam 40 is irradiated to the IGBT to make crystal defect in the N base layer 2, and thus the lifetime control, where the crystal defect serves as the center of the recombination of holes to increase the operating frequency while the IGBT is turned off, is carried out. At this time, there can be seen the phenomenon that positive fixed electric charge occurs in the insulating film 5 by the passing of the electron beam 40 through the gate insulating film 5 and the threshold voltage $V_{th}$ is reduced. The extent of the reduction becomes larger as the quantity of irradiation increases. Thus, the device should be designed, estimating in advance the reduction of the threshold voltage $V_{th}$ caused by the irradiation of electron beam, so that the threshold voltage $V_{th}$ after the irradiation comes to a desired value.

As can be seen in an equivalent circuit shown in FIG. 2, the IGBT cell has a parasitic PNPN thyristor structure. The parasitic thyristor includes an NPN transistor 10 consisting of the N base layer 2, the P well region 3 and the N+ emitter region 4 and a PNPN transistor 11 consisting of the P+ collector layer 1, the N base layer 2 and the P well region 3, and when both of the transistors 10, 11 turn on and the sum of respective current amplification factors $\alpha_1$, $\alpha_2$ of the transistors comes to 1, latch-up occurs. Since structurally the thickness of the N base layer serving as a base of the PNP transistor 11 is so thicker than the depth of the diffusion of carriers, the factor $\alpha_2$ comes to a relatively small value. The NPN transistor 10 is short-circuited between its emitter and base, and thus is difficult to turn on. The parasitic thyristor is not latched up in the ordinary operation, and accordingly, the IGBT cell works as a composite device of an n channel MOSFET 12 and the PNP transistor 11. In this case, since base current in the PNP transistor 11 is controlled by the n channel MOSFET 12, main current $I_C$ flowing from a collector terminal C of the IGBT can be controlled by a control signal applied to a gate terminal G. Assuming that current $I_E$ flows in an emitter terminal E, the following relations are established as follows:

$$I_C = I_E = I_e + I_h \tag{1}$$

However, as the main current $I_C$ increases because of an external cause such as noise applied to the gate terminal G, the electron current $I_e$ and the hole current $I_h$ increase. At this time, if the hole current $I_h$ comes to be beyond a specific value, the NPN transistor 10 becomes conductive due to voltage drop at a resistance $R_B$ in the P well region 3, the current amplification factor a $\alpha_1$ increases enough to satisfy $\alpha_1 + \alpha_2 = 1$, and the parasitic thyristor comes to be conductive. Thus, the IGBT comes to be latched up. Under the condition, the main current $I_C$ in the IGBT can hardly be controlled by the control signal applied to the gate terminal G, and excessively large main current $I_C$ flows without restriction. To prevent latch-up, impurity concentration in the P well region 3 must be increased to reduce resistance, and the ratio of the hole current $I_h$ flowing just under the N+ emitter region 4 to an emitter electrode 7 must be diminished.

FIG. 3 is a sectional view showing an example of an IGBT cell structure conventionally employed to prevent latch-up. In this example, the IGBT cell is rectangular in its plane surface, and a P well region 3 of the IGBT cell is formed with a P+ region 3 in its center by diffusing P-type impurity of the same conductivity type with high concentration. As a result, the resistance of the P well region 3 decreases, and the ratio of the hole current $I_h$ flowing in the center portion of the P well region 3 becomes relatively larger than the ratio of the hole current $I_h$ flowing just under the N+ emitter region 4, so as to inhibit the NPN transistor 10 from turning conductive.

FIG. 4 is a perspective sectional view showing another example of the IGBT cell structure conventionally employed to prevent latch-up. In this example, a P well region 3 is formed in a stripe, and an N+ emitter region 4 is formed in a broken stripe pattern where some parts of a stripe are removed. In this way, an area of the P well region 3 between the solid parts of the N+ emitter region 4 serves as a bypass for the hole current $I_h$ to lower the ratio of the hole current $I_h$ flowing just under the N+ emitter region 4. A P+ region 13 as shown in FIG. 3 is also formed.

If the above-mentioned structure shown in FIG. 3 is employed, especially in an IGBT device of high withstand voltage, the P well region 3 must be deep, and the P+ region 13 having high impurity concentration must accordingly be formed deeply. However, since the P+ region 13 is formed by diffusing impurity from the surface, it is unavoidable that the deeper in the P+ region 13, the lower the impurity concentration becomes, and it is impossible that resistance $R_{B1}$ extending in the vertical direction can not sufficiently decrease in resistance value in the deep area. Desirably, the P+ region 13 is formed extending in the entire area just under the N+ emitter region 4, but the P+ region 13 should not reach a channel region just under a gate electrode 6 because it causes the threshold voltage of a MOSFET 12 to change. Taking various errors in the formation into consideration, the P+ region 13 can not be formed considerably apart from the channel region, and it is impossible that resistance $R_{B2}$ extending in the lateral direction can not sufficiently decrease in resistance value in an area near the channel. Thus, there arises the problem that the structure shown in FIG. 3 is unsatisfactory to avoid latch-up.

On the other hand, according to the structure shown in FIG. 4, it is unavoidable that the channel is diminished due to the removal of some parts of the N+ emitter region 4. The reduction of the channel is disadvantageous to attaining large current capacity. The IGBT cell is a stripe in its plane configuration, and therefore there arises the problem that the densification of the cell arrangement is impeded comparing with an IGBT cell having a rectangular configuration when an IGBT device of large current capacity is manufactured with a lot of IGBT cells connected in parallel.

As shown in FIG. 2, when lifetime control is carried out so as to cause sufficient crystal defect in the N base layer 2 by directing the electron beam 40, the occurrence of the crystal defect necessarily causes the resistance value of the N base layer 2 to increase, and hence the ON resistance of the IGBT increases. In other words, there is trade-off relation between the ON resistance and turn-off time of the IGBT, and there is the problem that the trade-off relation is not optimized in the existing circumstances.

As stated above, since the threshold voltage $V_{th}$ of the IGBT is reduced by the irradiation of the electron beam 40, the device should be designed, estimating in advance the reduction of the threshold voltage $V_{th}$, so that the threshold voltage $V_{th}$ after the irradiation comes to a desired value, but it requires so much labor.

SUMMARY OF THE INVENTION

In an aspect, an insulated gate bipolar transistor according to the present invention comprises a first semiconductor layer of a first conductivity type having first and second major surfaces, a second semiconductor layer of a second conductivity type formed on the first major surface of the first semiconductor layer, a first semiconductor region of the first conductivity type selectively formed on a surface of the second semiconductor layer, a second semiconductor region of the second conductivity type selectively formed on a surface of the first semiconductor region, an insulating film formed on the surface of the first semiconductor region between the second semiconductor layer and the second semiconductor region, a control electrode formed on the insulating film, a first main electrode formed lying over the first and second semiconductor regions, and a second main electrode formed on the second major surface of the first semiconductor layer, with regard to a first number of positive fixed charges in the insulating film and a second number of levels in an interface between the insulating film and the first semiconductor region, the first and second numbers keeping the balance therebetween or the first number being much larger than the second number.

In another aspect, an insulated gate bipolar transistor according to the present invention comprises a first semiconductor layer of a first conductivity type having first and second major surfaces, a second semiconductor layer of a second conductivity type formed on the first major surface of the first semiconductor layer, a first semiconductor region of the first conductivity type selectively formed on a surface of the second semiconductor layer, a second semiconductor region of the second conductivity type selectively formed on a surface of the first semiconductor region, an insulating film formed on the surface of the first semiconductor region between the second semiconductor layer and the second semiconductor region, a control electrode formed on the insulating film, a first main electrode formed lying over the first and second semiconductor regions, and a second main electrode formed on the second major surface of the first semiconductor layer, the second semiconductor layer including a third semiconductor layer of the second conductivity type and of relatively high impurity concentration, which is formed on the first major surface of the first semiconductor layer and has crystal defects, and a fourth semiconductor layer of the second conductivity type and of relatively low impurity concentration, which is formed on the third semiconductor layer and has no crystal defects.

In still another aspect, a method of manufacturing an insulated gate bipolar transistor according to the present invention comprises the steps of preparing a first semiconductor layer of a first conductivity type having first and second major surfaces, forming a second semiconductor layer of a second conductivity type on the first major surface of the first semiconductor layer, selectively forming a first semiconductor region of the first conductivity type on a surface of the second semiconductor layer, selectively forming a second semiconductor region of the second conductivity type on a surface of the first semiconductor region, forming an insulating film on the surface of the first semiconductor region between the second semiconductor layer and the second semiconductor region, forming a control electrode on the insulating film, forming a first main electrode lying over the first and second semiconductor regions, forming a second main electrode on the second major surface of the first semiconductor layer, and irradiating an ionizing radiation from an upper side of the control electrode with a given voltage being applied between the control electrode and the first main electrode.

In yet another aspect, a method of manufacturing an insulated gate bipolar transistor according to the present invention comprises the steps of preparing a first semiconductor layer of a first conductivity type having first and second major surfaces, forming a second semiconductor layer of a second conductivity type on the first major surface of the first semiconductor layer, selectively forming a first semiconductor region of the first conductivity type on a surface of the second semiconductor layer, selectively forming a second semiconductor region of the second conductivity type on a surface of the first semiconductor region, forming an insulating film on the surface of the first semiconductor region between the second semiconductor layer and the second semiconductor region, forming a control electrode on the insulating film, forming a first main electrode lying over the first and second semiconductor regions, forming a second main electrode on the second major surface of the first semiconductor layer, irradiating a first ionizing radiation from an upper side of the control electrode with a given voltage being applied between the control electrode and the first main electrode so that a range of the first joining radiation comes close to the insulating film, and irradiating a second ionizing radiation from a side of the second main electrode, so that a range of the second joining radiation exists in the second semiconductor layer.

In further aspect, a method of manufacturing an insulated gate bipolar transistor according to the present invention comprises the steps of preparing a first semiconductor layer of a first conductivity type having first and second major surfaces, forming a second semiconductor layer of a second conductivity type on the first major surface of the first semiconductor layer, the step of forming the second semiconductor layer including the steps of forming a third semiconductor layer of the second conductivity type, and of relatively high impurity concentration on the first major surface of the first semiconductor layer, and forming a fourth semiconductor layer of the second conductivity type and of relatively low impurity concentration on the third semiconductor layer, selectively forming a first semiconductor region of the first conductivity type on a surface of the fourth semiconductor layer, selectively forming a second semiconductor region of the second conductivity type on a surface of the first semiconductor region, forming an insulating film on the surface of the first semiconductor region between the fourth semiconductor layer and the second semiconductor region, forming a control electrode on the insulating film, forming a first main electrode lying over the first and second semiconductor regions, forming a second main electrode on the second major surface of the first semiconductor layer, and irradiating an ionizing radiation which causes crystal defects to be distributed in a range smaller than a thickness of the third semiconductor layer, from a side of the second main electrode, so that a range of the ionizing radiation comes close to a center of the third semiconductor layer.

According to an aspect of the present invention, with regard to the number of positive fixed electric charges in an insulating film and the number of levels in the interface between the insulating film and a first semiconductor region, the former and the latter keep the balance, or the former is much larger than the latter, in an insulating gate bipolar transistor. When the former and the latter keep the balance, both of them give an influence to each other and cancel it, and hence the threshold voltage $V_{th}$ does not exist. On the other hand, when the former is much larger than the latter, the threshold voltage $V_{th}$ drops due to the influence of the positive fixed electric charge. If the first semiconductor region is made with high concentration so that the parasitic transistor formed of a second semiconductor region, the first semiconductor region and a second semiconductor layer does not easily work, the threshold voltage $V_{th}$ rises. When the rise and above-mentioned drop of the threshold voltage $V_{th}$ cancel, the threshold voltage $V_{th}$ never changes.

According to another aspect of the present invention, although an insulating gate bipolar transistor includes a second semiconductor layer formed of a third semiconductor layer having a relatively high impurity concentration and a fourth semiconductor layer having a relatively low impurity concentration, no baneful influence caused by crystal defect is given in the fourth semiconductor layer, because crystal defect is caused merely in the third layer.

According to still another aspect of the present invention, in manufacturing an insulating gate bipolar transistor, while specific voltage is applied between a control electrode and a first main electrode, ionizing radiation is directed from the upper part of the control electrode. Then, depending upon the state of voltage application, the number of positive fixed electric charges in an insulating film and the number of levels in the interface between the insulating film and a first semiconductor region can be set so that they keep the balance, or the former is much larger than the latter. In this way, a change in the threshold voltage $V_{th}$ can be avoided in the same way as that described in the above-mentioned first aspect of the present invention.

According to yet another aspect of the present invention, in manufacturing an insulating gate bipolar transistor, while specific voltage is applied between a control electrode and a first main electrode, ionizing radiation is directed so that its range covers the vicinity of an insulating film. Then, depending upon the state of voltage application, the number of positive fixed electric charges in the insulating film and the number of levels in the interface between the insulating film and a first semiconductor region can be set so that the former is much larger than the latter. In this way, a change in the threshold voltage $V_{th}$ can be avoided in the same way as that described about the above first aspect. Moreover, a first ionizing radiation is hardly directed to a second semiconductor layer, so that the first ionizing radiation never be the cause of the lifetime control. On the other hand, a second ionizing radiation is directed from the upper part of a major surface of a second main electrode so that its range is within the second semiconductor layer. Then, crystal defect is made in the semiconductor layer to carry out the lifetime control. The second ionizing radiation is not directed near the insulating film, and hence the threshold voltage $V_{th}$ is not changed due to the second ionizing radiation.

According to a further aspect of the present invention, in manufacturing an insulating gate bipolar transistor which includes a second semiconductor layer formed of a third semiconductor layer having a relatively high impurity concentration and a fourth semiconductor layer having a relatively low impurity concentration, an ionizing radiation by which crystal defects are made distributed in a range smaller than the thickness of the third semiconductor layer is directed from the upper part of a major surface where the second main electrode is formed, so that crystal defect is formed merely in the third semiconductor layer. Therefore, no baneful influence caused by crystal defect is given in the fourth semiconductor layer.

Accordingly, it is an object of the present invention to provide an insulated gate bipolar transistor capable of impeding or controlling a change in the threshold voltage before and after the irradiation of an ionizing radiation such as an electron beam and of making the best trade-off relation between the ON resistance value and the turn-off time while latch-up is effectively prevented, and having a structure suitable for taking a large current capacity and densifying a cell arrangement.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 5:
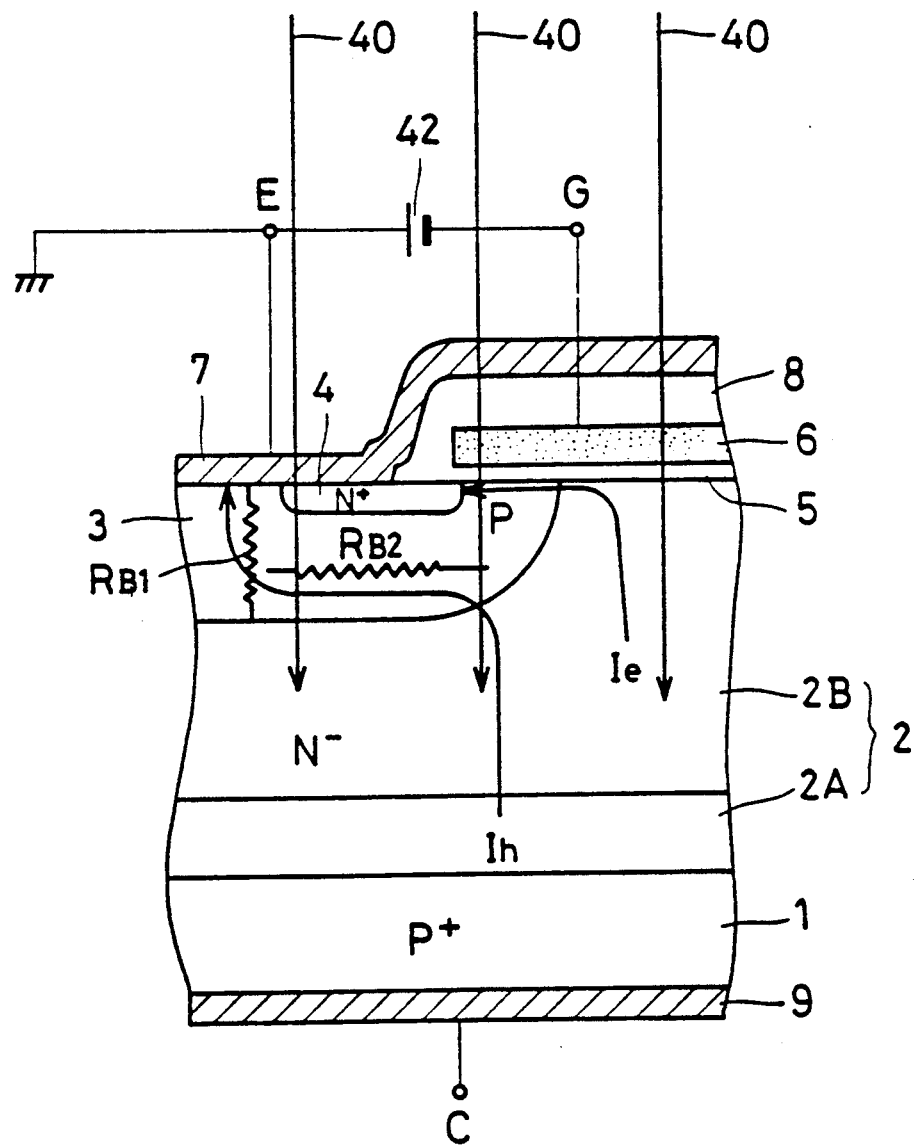
FIGS. 5 to 7 are sectional views showing first to third embodiments of an IGBT according to the present invention.

FIG. 5 is a sectional view showing a first embodiment of an IGBT according to the present invention. In FIG. 5, a P+ collector layer 1 is made of a P+ semiconductor substrate. An N+ epitaxial layer 2A is formed on a major surface of the P+ collector layer, and an N− epitaxial layer 2B is formed on the N+ epitaxial layer 2A. An N base layer of the IGBT is formed of the N+ epitaxial layer 2A and the N− epitaxial layer 2B (hereinafter, the N+ epitaxial layer 2A and the N− epitaxial layer 2B are referred to as "N base layer 2", en bloc) A P well region 3 is formed in an area of a part of the surface of the N− epitaxial layer 2B by selectively diffusing P-type impurity, and an N+ emitter region 4 is formed in an area of a part of the surface of the P well region 3 by selectively diffusing N-type impurity of high concentration. A gate insulating film 5 is formed on the surface of the P well region 3 between the surface of the N− epitaxial layer 2B and the surface of the N+ emitter region 4, and the gate insulating film 5 is also formed on the surface of the N− epitaxial layer 2B so that it is continuous between adjacent IGBT cells. A gate electrode 6 made of polysilicon, for example, is formed on the gate insulating film 5, and an emitter electrode 7 made of metal such as aluminum is formed electrically connecting to both the P base region 3 and the N+ emitter region 4. The gate electrode 6 and the emitter electrode 7 make a multi-layered configuration with an insulating film 8 intervening therebetween, so as to electrically connect to all IGBT cells commonly. A collector electrode 9 made of metal is formed on the bottom face of the P+ collector layer 1 as a single electrode for all the IGBT cells in common. Thus, the IGBT of this embodiment has the same structure as the conventional IGBT shown in FIG. 1, and its basic operation is also the same as that of the conventional IGBT.

Voltage is applied from a power source 42 between the emitter electrode 7 and the gate electrode 6 of the IGBT structured as stated above so that the voltage at the gate electrode 6 comes to be negative. In this condition, similar to the conventional manner, when the IGBT is directed by an electron beam 40 which is a kind of ionizing radiation, an electron and hole in combination which are generated in the gate insulating film 5 move along a line of electric force, respectively, and hence the rate of recombination is reduced. Thus, although positive filled electric charges in the gate insulating film 5 increase in number, an electron which has similarly moved along the line of electric force makes an acceptor-type of interface level in the interface between the gate insulating film 5 and the P well region 3. Since the positive fixed electric charge and the acceptor-type of interface level cancel an influence given to each other, the reduction of the threshold voltage $V_{th}$ before and after the irradiation of the electron beam 40 can be impeded if the voltage from the power source 42 is optimized so that both of the positive fixed electric charge and the acceptor-type interface level keep the balance. Thus, unlike the conventional way, there is no necessity of estimating in advance the reduction of the threshold voltage $V_{th}$ due to the irradiation of the electron beam 40 in designing the device, and better lifetime control can be implemented.

Figure 6:
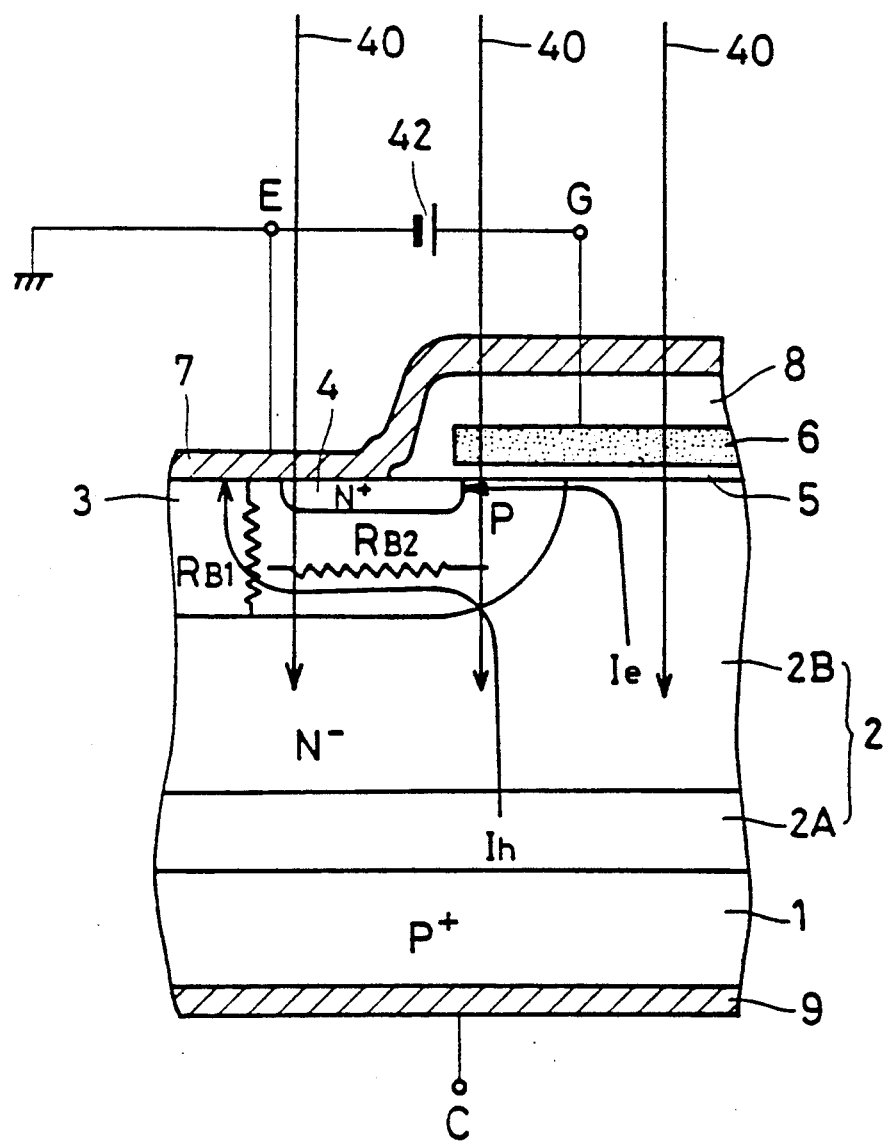

FIG. 6 is a sectional view showing a second embodiment of the IGBT according to the present invention. In FIG. 6, the basic device structure is similar to that in FIG. 5 except for the P well region 3. The P well region 3 in FIG. 6 is formed with sufficiently high concentration so that internal resistances $R_{B1}$, $R_{B2}$ lower to the extent that there is no influence on the operation, or so that a parasitic NPN transistor consisting of the N+ emitter region 4, the P well region 3 and the N base layer 2 is inactivated. In this way, the threshold voltage $V_{th}$ increases because the concentration in the P well region 3 just under the gate insulating film 5 rises.

Voltage is applied from the power source 42 between the emitter electrode 7 and the gate electrode 6 in the IGBT structured as stated above so that the voltage at the gate electrode 6 comes to be positive. In this condition, when the electron beam 40 which is a kind of ionizing radiation is directed as usual, an electron and a hole in combination which are generated in the gate insulating film 5 move along a line of electric force, respectively, and the rate of recombination is reduced. Thus, although fixed electric charges in the gate insulating film 5 are increased in number, the electron is rapidly absorbed by the gate electrode 6, so that there is formed no acceptor-type of interface level in the interface between the gate insulating film 5 and the P well region 3 unlike the above-mentioned first embodiment. An increase in the positive fixed electric charges leads to a drop of the threshold voltage $V_{th}$, and hence it cancel an increase in the threshold voltage $V_{th}$ due to a rise of the concentration in the P well region 3. Then, since the rate of the recombination of an electron with a hole can be controlled by the electric field strength in the gate insulating film 5, a desired value of the threshold voltage $V_{th}$ can be obtained after the irradiation of the electron beam 40 by optimizing the applied voltage from the source 42. The irradiation of the electron beam 40 implements the lifetime control in the N base layer 2 as it originally aims, and thus the lifetime control and the threshold voltage $V_{th}$ control can be simultaneously done.

Figure 7:
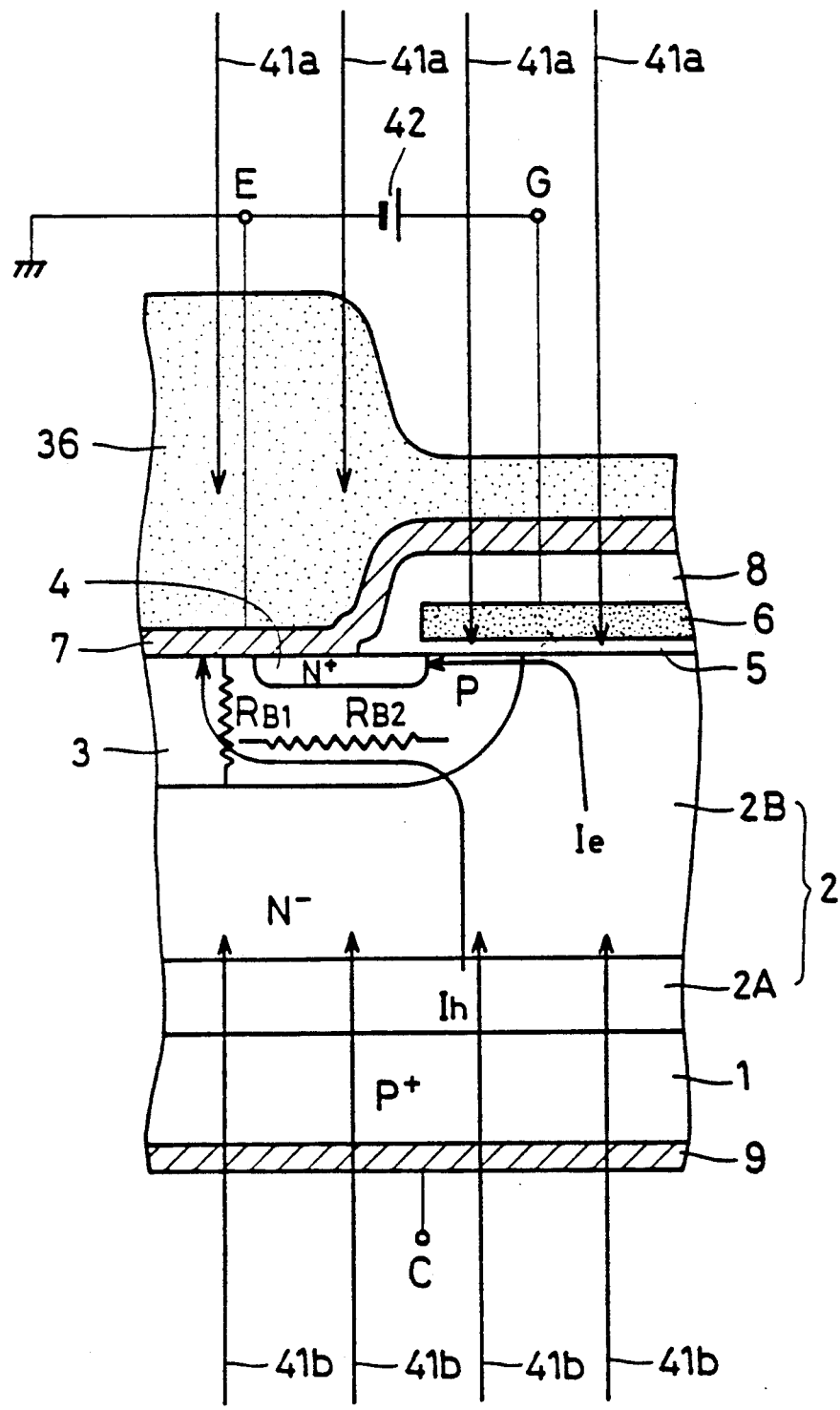

FIG. 7 is a sectional view showing a third embodiment of the IGBT of the present invention. In FIG. 7, the basic structure of the IGBT is the same as that in FIG. 5 except of the P well region 3. The P well region 3 in FIG. 7 is formed with sufficiently high concentration similar to the embodiment shown in FIG. 6 so that the internal resistances $R_{B1}$, $R_{B2}$ are reduced to the extent there is no influence on the operation of the parasitic thyristor. As a result, the concentration of the P well region 3 just under the gate insulating film 5 increases, and hence the threshold voltage $V_{th}$ rises.

In this embodiment, a mask 36 is formed on the emitter electrode 7, and a low-energy light ion beam 41a which is a kind of ionizing radiation of which range is in the vicinity of the gate insulating film 5 is directed through the mask 36 selectively to the gate electrode 6 alone. Proton (hydrogen ion H+) may be used as the light ion beam 41a, for example. During the irradiation, voltage is applied between the emitter electrode 7 and the gate electrode 6 from the power source 42 so that the voltage at the gate electrode 6 come to be positive. Although the low-energy light ion beam 41a generates an electron and a hole in combination in the gate insulating film 5, they move along a line of electric force, respectively, so that the rate of recombination is reduced. As a result, although the positive fixed electric charges in the gate insulating film 5 are increased in number, the electron is rapidly absorbed by the gate electrode 6, and there is made no acceptor-type interface level in the interface between the gate insulating film 5 and the P well region 3. Since an increase in the positive fixed electric charges leads to a drop of the threshold voltage $V_{th}$, it cancels an increase in the threshold voltage $V_{th}$ due to a rise of the concentration in the P well region 3. Then, since the rate of recombination of the electron and the hole can be controlled by the electric field strength in the gate insulating film 5, a desired value of the threshold voltage $V_{th}$ can be obtained after the irradiation of the low-energy light ion beam 41a by optimizing the applied voltage from the power source 42.

It is desirable that the irradiation of the low-energy light ion beam 41a gives no influence on the P well region 3 and the N base layer 2 by precisely controlling the range of the light ion beam 41a in the position of the gate insulating film 5, but the fluctuation of the range causes the irradiation to give an influence in an area very closely to the surface of the P well region 3 and the N base layer 2. The quantity of ion irradiation required for generating electron-hole combinations in the gate insulating film 5 to the extent that the aforementioned effect can be obtained is usually considerably smaller than the quantity required for lifetime control, and therefore, such an influence can be ignored.

After that, a high-energy light ion beam 41b of which range is in the N base layer 2 is directed from the part of a collector electrode 9 to precisely carry out the lifetime control. This way of lifetime control can implement a better trade-off relation between the ON voltage (collector-emitter saturation voltage) $V_{CES}$ and the turn-off time $t_{off}$ compared with the above-mentioned way of lifetime control using an electron beam. According to this embodiment, an IGBT in which latch-up is avoided and a better $V_{CES}$-$t_{off}$ trade-off relation is implemented can be manufactured.

It is also possible that the concentration of the P well region 3 is almost the same as in the first embodiment, voltage is applied so that the voltage of the gate electrode 6 comes to be negative and the low-energy light ion beam 41a is directed, so as to impede a drop of the threshold voltage $V_{th}$ according to a theory explained related to the first embodiment.

FIGS. 8A to 8D are sectional views showing steps of manufacturing the IGBTs of the first to third embodiments. The P well region 3 in this case consists of a first P well region 3a having a relatively low impurity concentration and small in depth and a second P well region 3b formed in the center portion of the first P well region 3a, having a relatively high impurity concentration and large in depth.

Figure 8A:
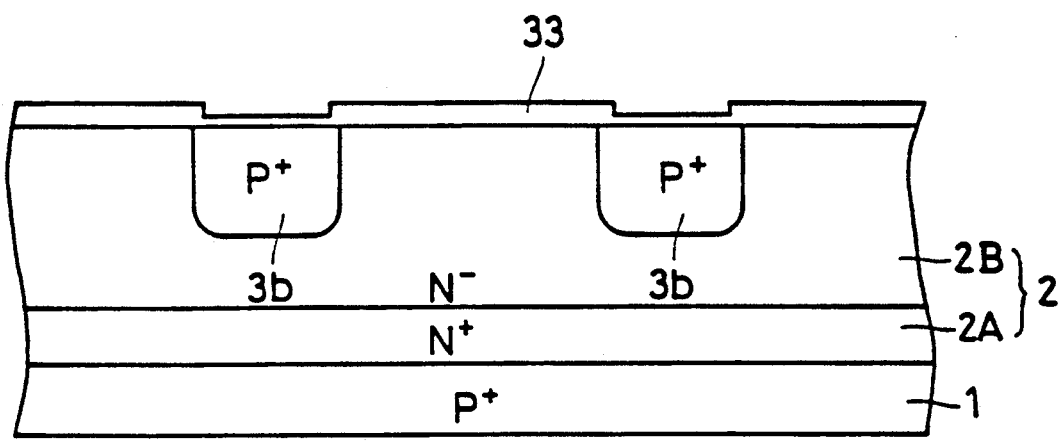
FIGS. 8A to 8D are sectional views showing a method of manufacturing the IGBT of the first to third embodiments.

As shown in FIG. 8A, the N+ epitaxial layer 2A is formed with a thickness of approximately 10 μm on a first major surface of the P+ collector layer 1 made of the P+ silicon substrate by means of epitaxial growth. Then, the N− epitaxial layer 2B is formed with a thickness of 50 to 100 and several tens μm on the N+ epitaxial layer 2A by means of epitaxial growing. A silicon oxide film is formed on the N− epitaxial layer 2 and patterned to make a mask 33. Then, P-type impurity such as boron is selectively implanted to the N− epitaxial layer 2A through the mask 33. The implanted impurity is diffused to make the second P well region 3b having a surface concentration of approximately $5 \times 10^{16}$ to $1 \times 10^{19}$ cm$^{-3}$.

Figure 8B:
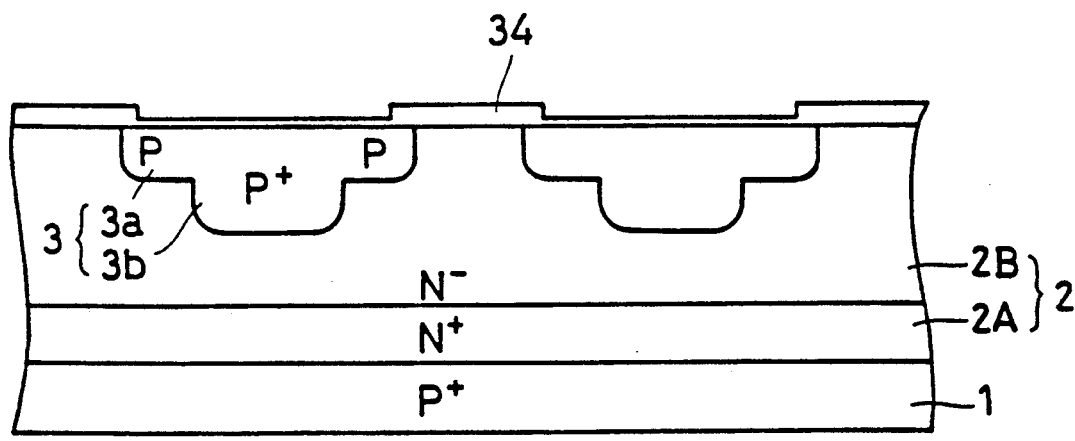

Then, as shown in FIG. 8B, the mask 33 is removed and another mask 34 is formed. P-type impurity such as boron is selectively implanted to the N− epitaxial layer 2B through the mask 34. The implanted impurity is diffused to make the first P well region 3a which is lower in concentration and smaller in depth than the second P well region 3b. Thus, the p well region 3 is formed having a first P well region 3a and the second P well region 3b formed in the center portion thereof.

Figure 8C:
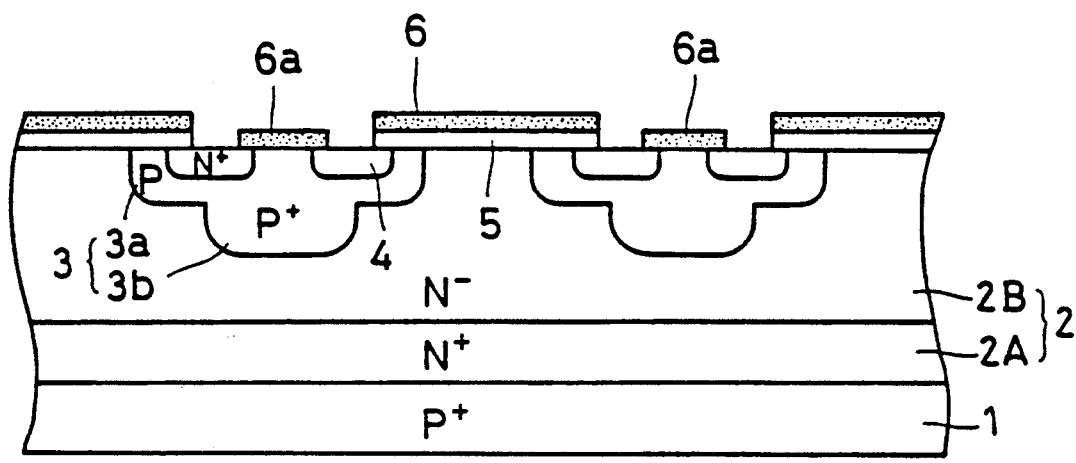

Further, as shown in FIG. 8C, the mask 34 is removed, and instead an oxide film and a polysilicon film is formed on the entire surface and then patterned to make the gate insulating film 5, the gate electrode 6 and the polysilicon layer 6a. Then, N-type impurity such as phosphorus is selectively diffused in the P well region 3 through masks of the gate electrode 6 and the polysilicon layer 6a to form the N+ emitter region 4 in a selfregulating manner.

Figure 8D:
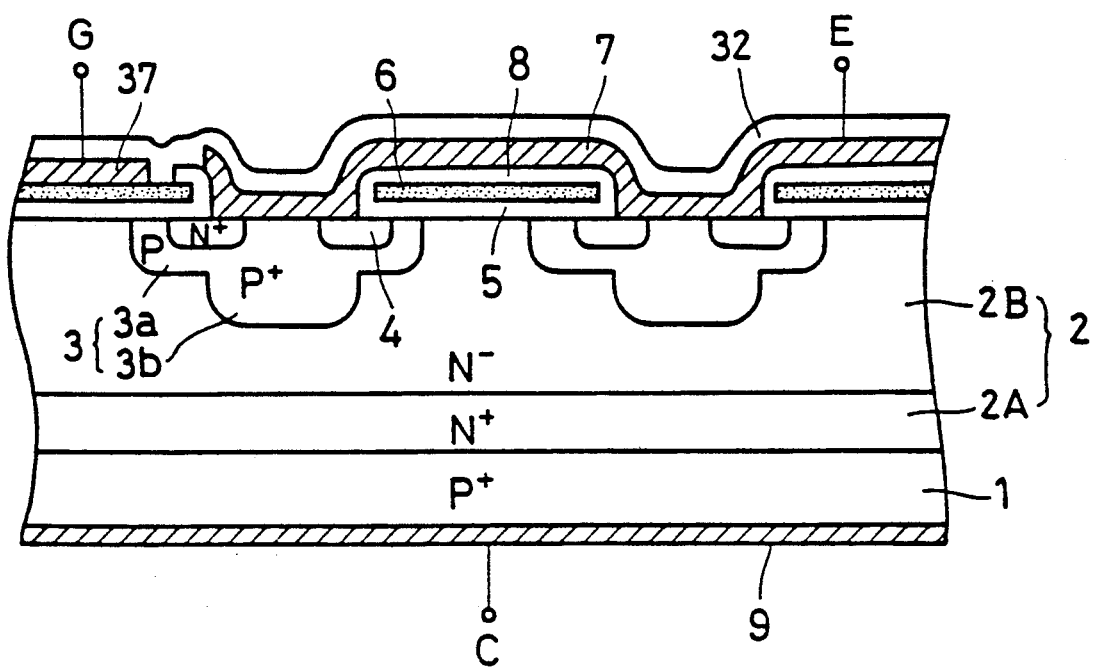

As shown in FIG. 8D, after the polysilicon layer 6a is removed, an insulating film 8 is formed on the entire surface and patterned. Then a metal layer is formed on the entire surface and patterned to form the emitter electrode 7 electrically connected to the N+ emitter region 4 and a gate extracting portion 37 electrically connected to the gate electrode 6. After that, the electron beam 40, or the low-energy light ion beam 41a and the high-energy light ion beam 41b are directed according to the procedure explained in conjunction with FIGS. 4 to 7.

Figure 9A:
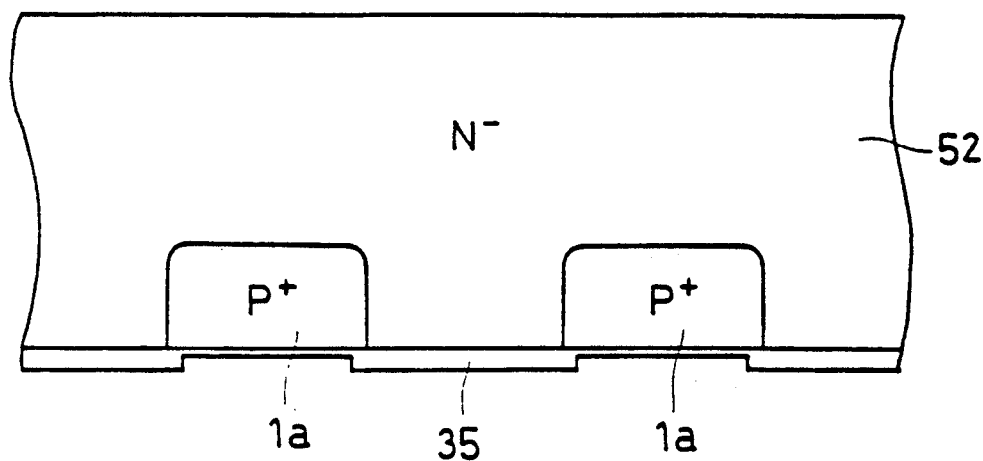
FIGS. 9A and 9B are sectional views showing a method of manufacturing the IGBT of a fourth embodiment according to the present invention.
Figure 9B:
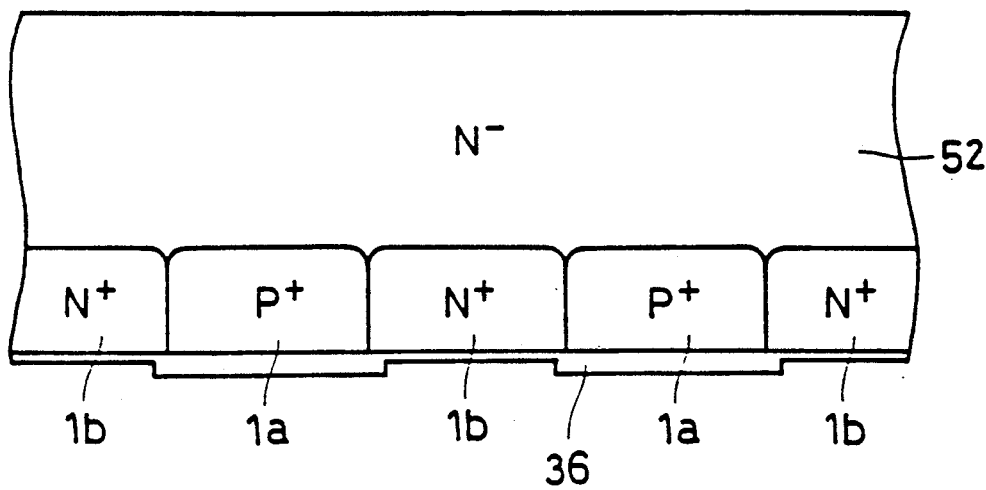

Then, a fourth embodiment which is an embodiment of the aforementioned third embodiment will be described. FIGS. 9A and 9B are sectional views showing a method of manufacturing an IGBT of the fourth embodiment. As shown in FIG. 9A, a mask 35 is formed on a major surface of an N− substrate 52, and a gas of high concentration is diffused through the mask 35 to form a P+ collector region 1a having a surface concentration of approximately $10^{20}$ cm$^{-3}$. Then, as shown in FIG. 9B, another mask 36 is formed after the mask 35 is removed, and an N+ collector region 1b is formed by diffusing a gas of high concentration. The following steps are carried out in the same way as in the steps shown in FIGS. 8A to 8D (though an N− substrate 52 is substituted for the N base layer 2).

Figure 10:
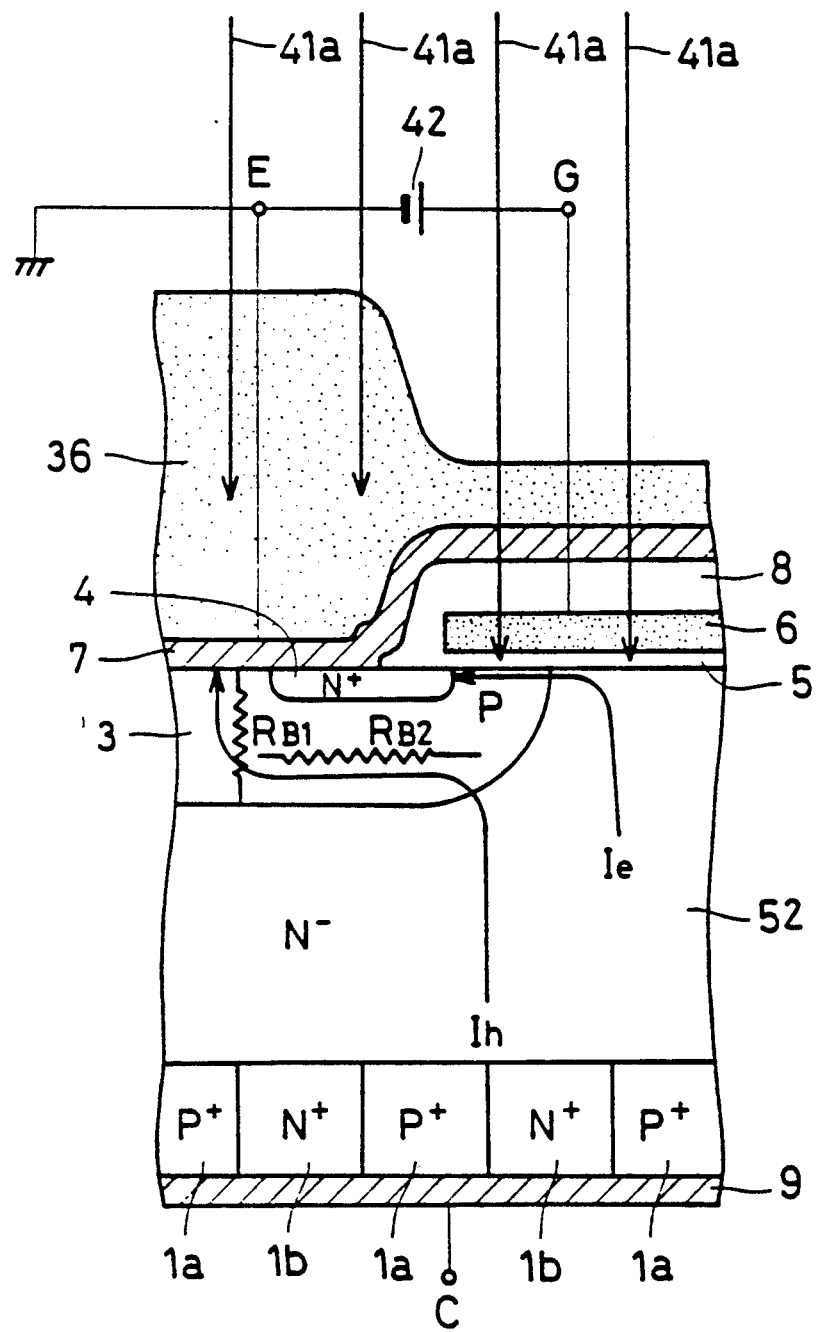
FIG. 10 is a sectional view showing a structure of the IGBT of the fourth embodiment.

The IGBT structured as stated above is shown in FIG. 10. The IGBT shown in FIG. 10 has a structure different from that of the conventional IGBT shown in FIG. 1 in that a part of the collector region serves as the N+ layer 1b and the N− substrate 52 is substituted for the N base layer 2. The N+ layer 1b is connected to the N− substrate base layer 52 while connected to the P+ collector region 1a with a metal wiring 9 in the collector surface, and thus the N− substrate base layer 52 and the P+ collector region 1a are short-circuited. In this structure, because of the effect that the rate of electron current $I_e$ in the collector current $I_C$ is increased or the efficiency of injection of holes from the collector is reduced, rapid turning off can be advantageously implemented without using a usual method such as the optimization of a buffer layer (which corresponds to the N+ epitaxial layer 2A) and the lifetime control.

In this collector short-circuited IGBT of the fourth embodiment, in order to effectively prevent latch-up, the P well region 3 is formed with sufficiently high concentration so that the inner resistances $R_{B1}$ and $R_{B2}$ are reduced to the extent that they give no influence on the operation of the parasitic thyristor. As a result, since the concentration of the P well region 3 just under the gate insulating film 5 rises, the threshold voltage $V_{th}$ increases. Similar to the aforementioned third embodiment, the mask 36 is formed on the emitter electrode 7, and the low-energy light ion beam 41a of which range is in the vicinity of the gate insulating film 5 is selectively directed to the gate electrode 6 alone through the mask 36. During the irradiation, similar to the third embodiment, voltage is applied between the emitter electrode 7 and the gate electrode 6 by the power source 42 so that the voltage at the gate electrode 6 comes to be positive. The applied voltage from the power source 42 is optimized, so that, as stated above about the third embodiment, an increase in the threshold voltage $V_{th}$ due to the aforementioned rise of the concentration of the P well region 3 is cancelled after the irradiation of the low-energy light ion beam 41a so as to obtain a desired value of the threshold voltage $V_{th}$. As stated above, an influence caused by the fluctuation of the range of the low-energy light ion beam 41a can be ignored.

According to the fourth embodiment, an IGBT can be implemented in which the trade-off relation between the ON voltage $V_{CES}$ and the turn-off time $t_{off}$ is optimized because of the collector short-circuited structure, latch-up is effectively prevented keeping high integration, and the threshold voltage $V_{th}$ is optimized due to the irradiation of a low-energy light ion beam.

Figure 11:
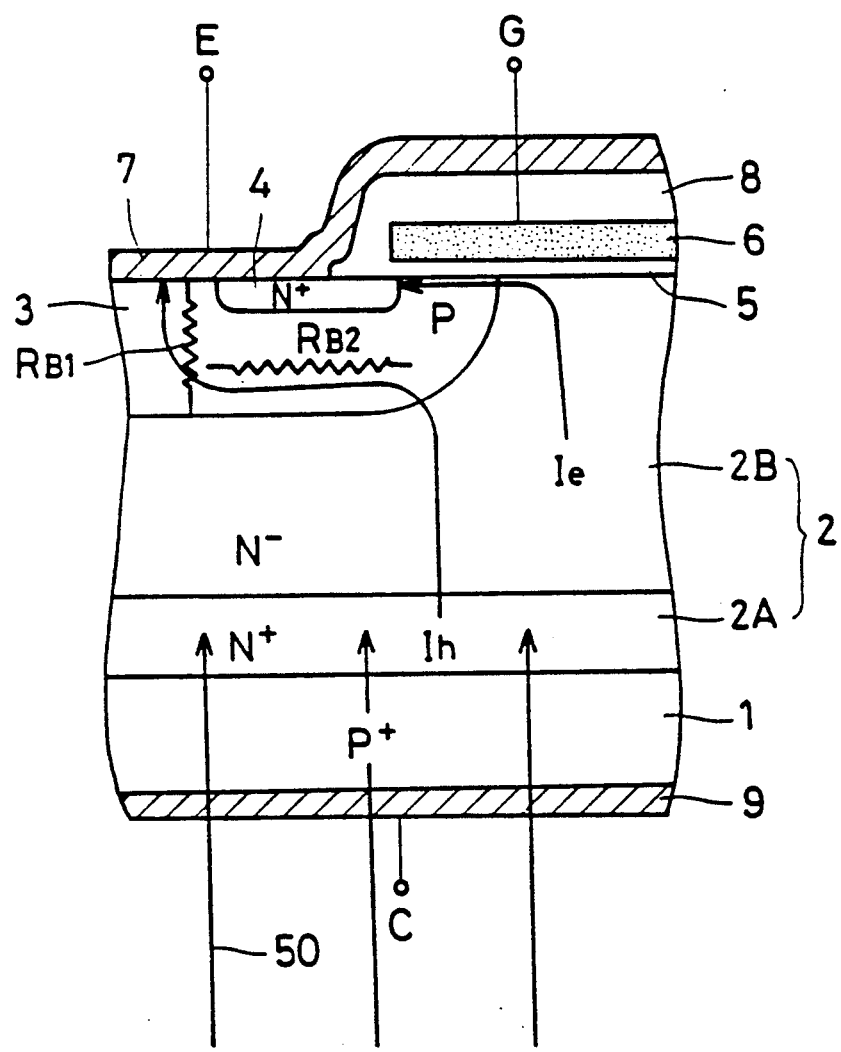
FIG. 11 is a sectional view showing a fifth embodiment of the IGBT according to the present invention.

FIG. 11 is a sectional view showing a fifth embodiment of the IGBT according to the present invention. The basic device structure shown in FIG. 11 is the same as that in FIG. 5.

Figure 12:
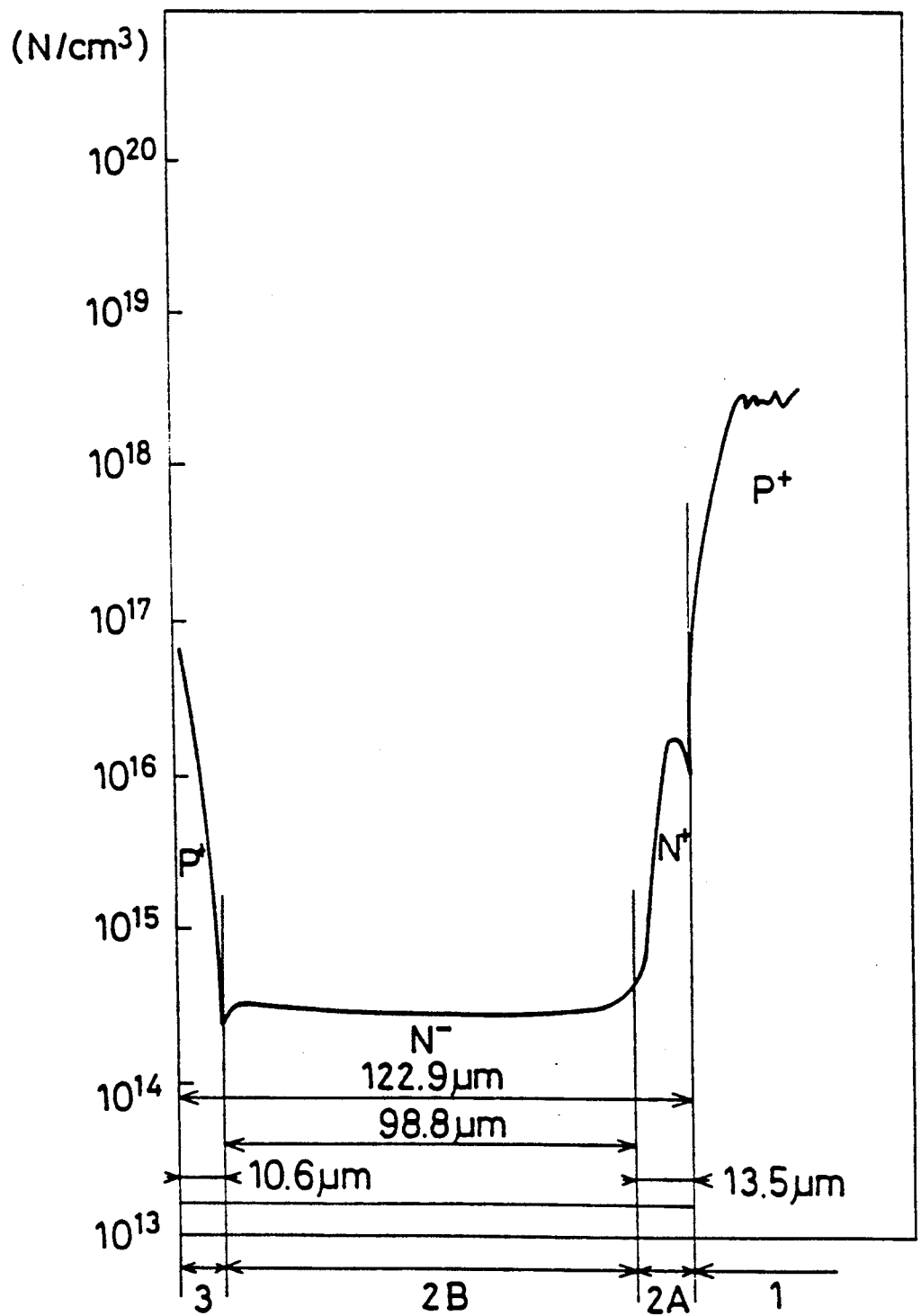
FIG. 12 is a graph showing a concentration profile of the fifth embodiment of the IGBT according to the present invention.

FIG. 12 is a graph showing an example of a concentration profile of the IGBT shown in FIG. 11. As shown in FIG. 11, the P well region 3 has a thickness of 10.6 μm, the N− epitaxial layer 2B has a thickness of 98.8 μm, and the N+ epitaxial layer 2A has a thickness of 13.5 μm.

In the IGBT structured in this way, a light ion beam 50 is directed from the part near the collector electrode 9 so that its range is close to the center portion in the N+ epitaxial layer 2A, and crystal defect is caused merely in the N+ epitaxial layer 2A, so as to precisely carry out the lifetime control.

Advantages and desired various conditions of this embodiment will be discussed in detail below.

Figure 1:
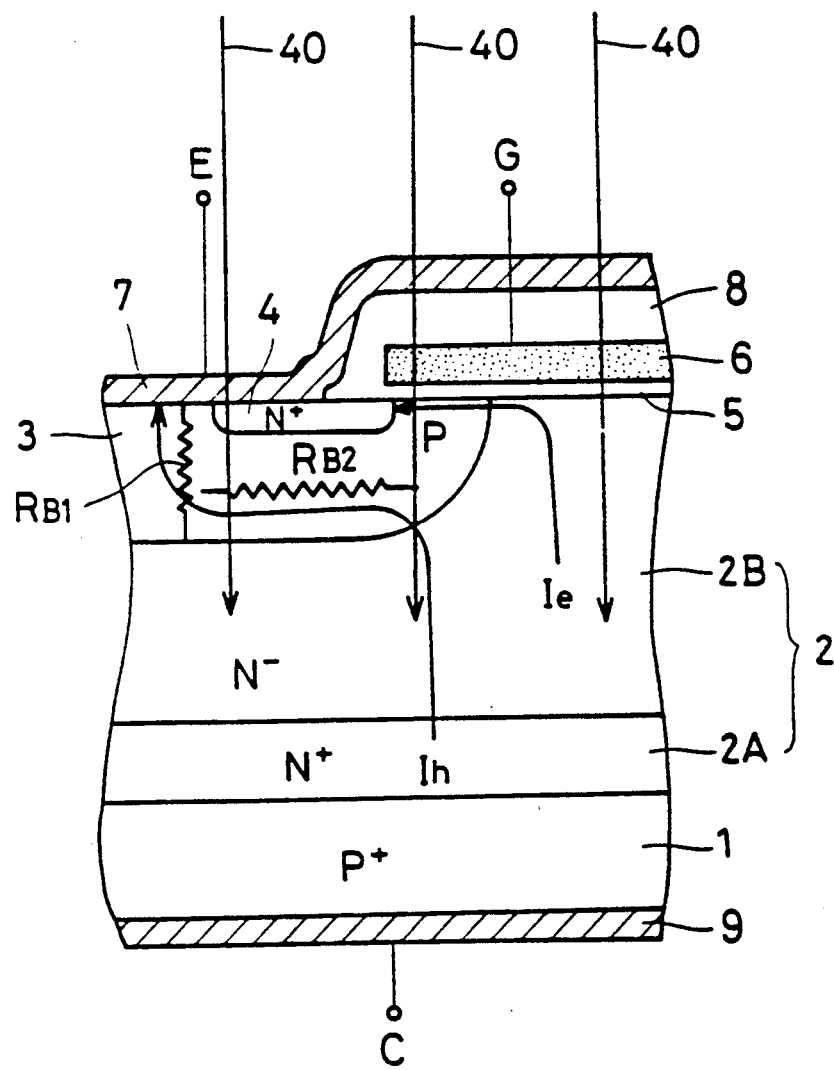
FIG. 1 is a sectional view showing a structure of a conventional IGBT.
Figure 2:
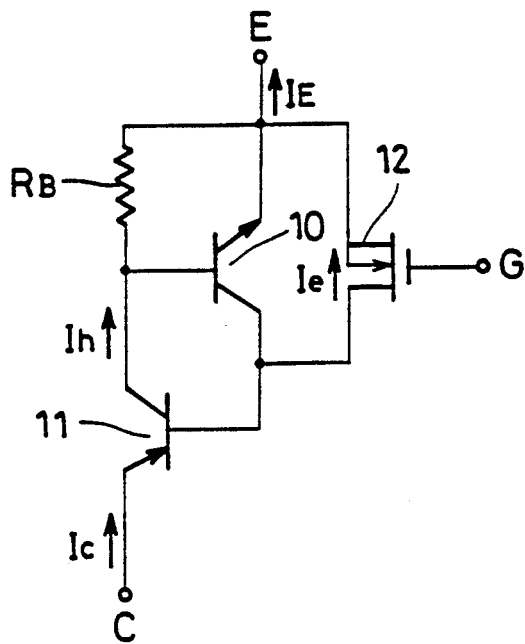
FIG. 2 is a circuit diagram showing an equivalent circuit.
Figure 3:
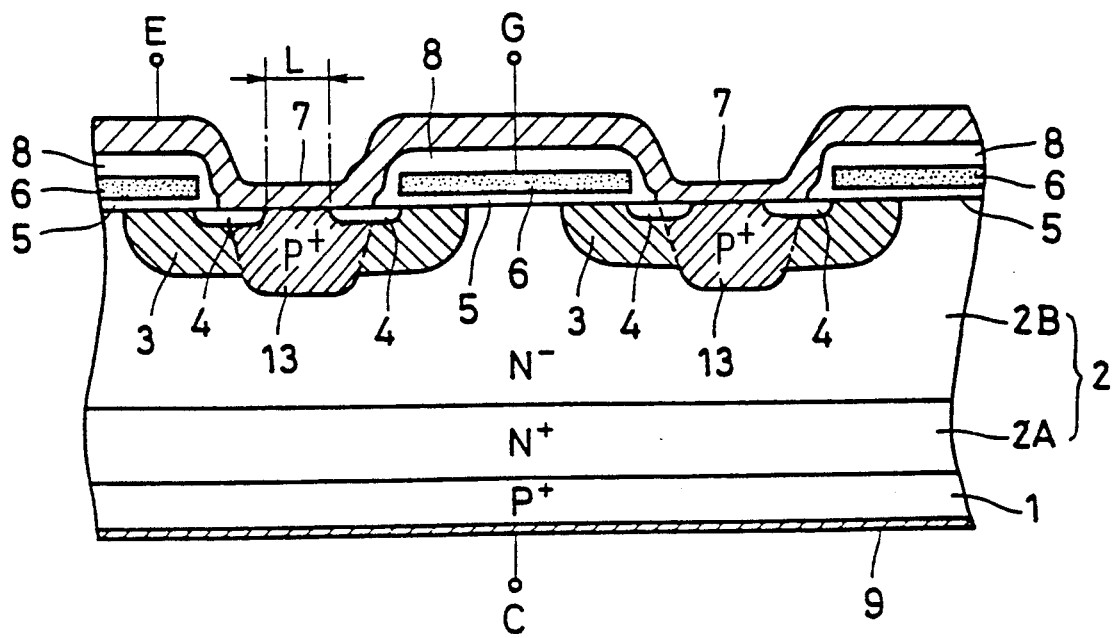
FIGS. 3 and 4 are a sectional view and a perspective sectional view showing the conventional IGBT for preventing latch-up.
Figure 4:
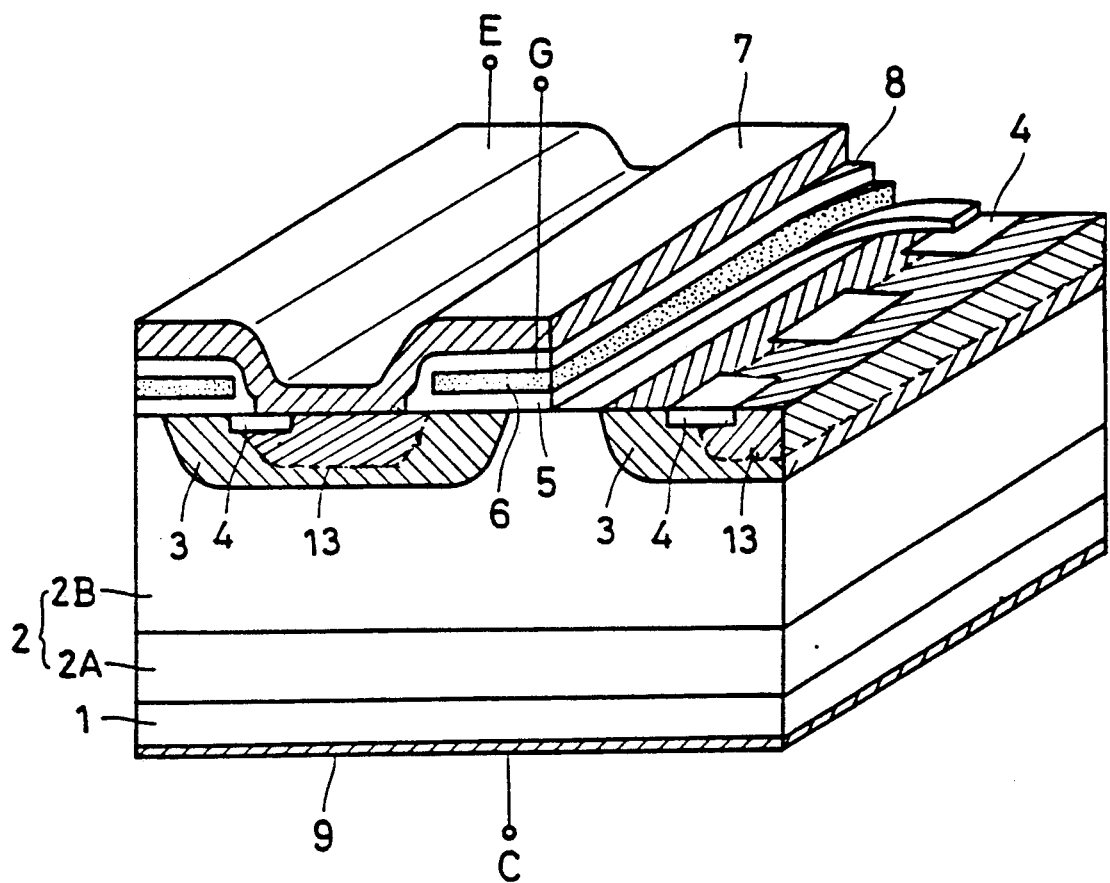
Figure 13:
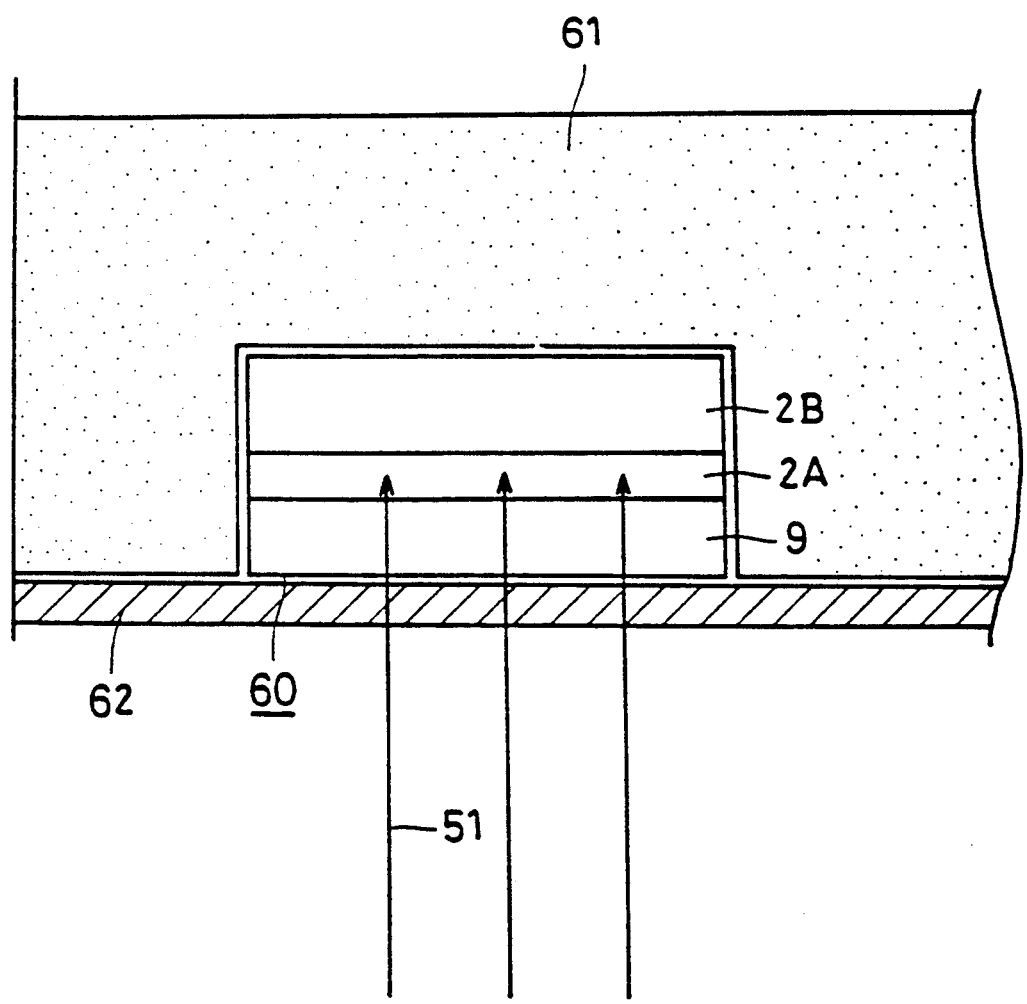
FIG. 13 is a sectional view showing a holding plate carrying the fifth embodiment of the IGBT according to the present invention.

In the embodiment shown in FIG. 11, a diatomic helium ion ($He^{2+}$) can be used as the light ion beam 50, for example. FIG. 13 is a diagram presented for explaining a process of bombarding a helium ion 51 to the N+ epitaxial layer 2A shown in FIG. 7. For convenience of explanation, the parts such as the P well region 3 and the gate electrode 5 formed in or on the N− epitaxial layer 2B are omitted in FIG. 11. The steps of manufacturing the IGBT structured as shown in FIG. 1 are just illustrated in FIG. 8A to 8D.

As shown in FIG. 13, an aluminum holding plate 61 is formed with a concave portion in one of its major surfaces, and an IGBT 60 shown in FIG. 11 is stored in the concave portion. An aluminum foil 62 covers the concave portion to fix the IGBT within the concave portion, and the concave portion is kept vacuous approximately $10^{-3}$ to $10^{-4}$ Torr to put the IGBT in a vacuous isolated condition. The aluminum foil 62 serves as an energy-absorber in bombarding the helium ion 51 into the IGBT 60.

Under the condition, the helium ion 51 is bombarded so that its range comes close to the center in the N+ epitaxial layer 2A.

Figure 14:
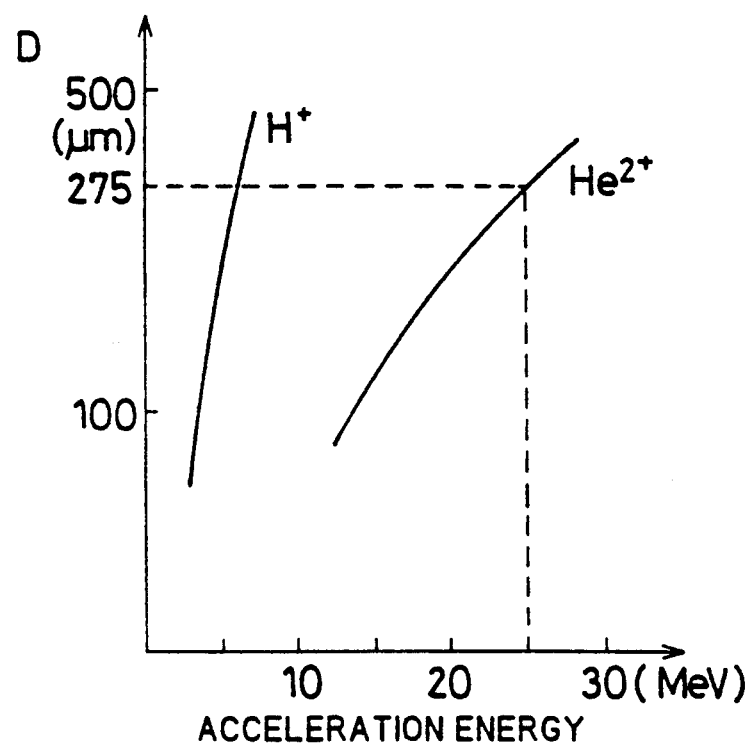
FIGS. 14 to 20 are graphs showing an effect of the IGBT of the fifth embodiment.

FIG. 14 is a graph showing the result of measurement of acceleration energy of an hydrogen ion and a helium ion ($H^+$) and respective ranges in silicon. The thickness of the aluminum foil 62 of FIG. 13 in the measurement is 20 μm. In the ordinary IGBT 60, the P+ collector layer 1 has a thickness of 270 μm and the N+ epitaxial layer 2A has a thickness of about 10 μm, so that the helium ion of the acceleration energy of 25 MeV may be bombarded to attain the range of 275 μm in the vicinity of the center of the N+ epitaxial layer 2A, as Will be recognized in FIG. 14. This is a sufficiently practical value of acceleration energy. On the other hand, the hydrogen ion may have the acceleration energy smaller than that of the helium ion as can be seen in FIG. 14, but its use in this embodiment is limited as will be recognized from the following description. Ions such as a lithium ion ($L_i^+$) which are heavier than the helium ion require much larger acceleration energy than the helium ion as they are heavier. If the acceleration energy is too large, it should be restricted from an aspect of practical use.

Figure 15:
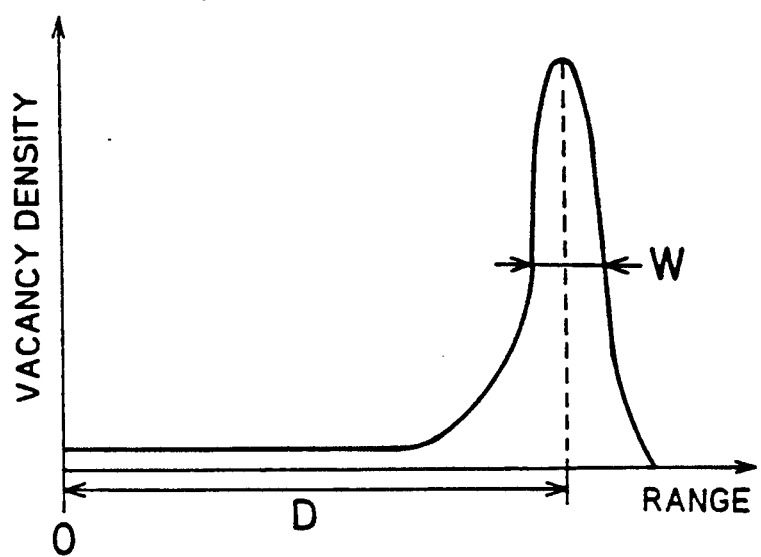

FIG. 15 is a graph showing a distribution of crystal defects caused by the ion bombardment. As shown in FIG. 15, the crystal defects have a local distribution of which peak exists near a range D of the bombarded ions. In other words, as a result of the ion bombardment, most of the crystal defects (mainly, vacancies) are caused within, a width W of which middle point is the range D (referred to as "defect distribution half-value width" hereinafter), as shown in FIG. 15.

Figure 16:
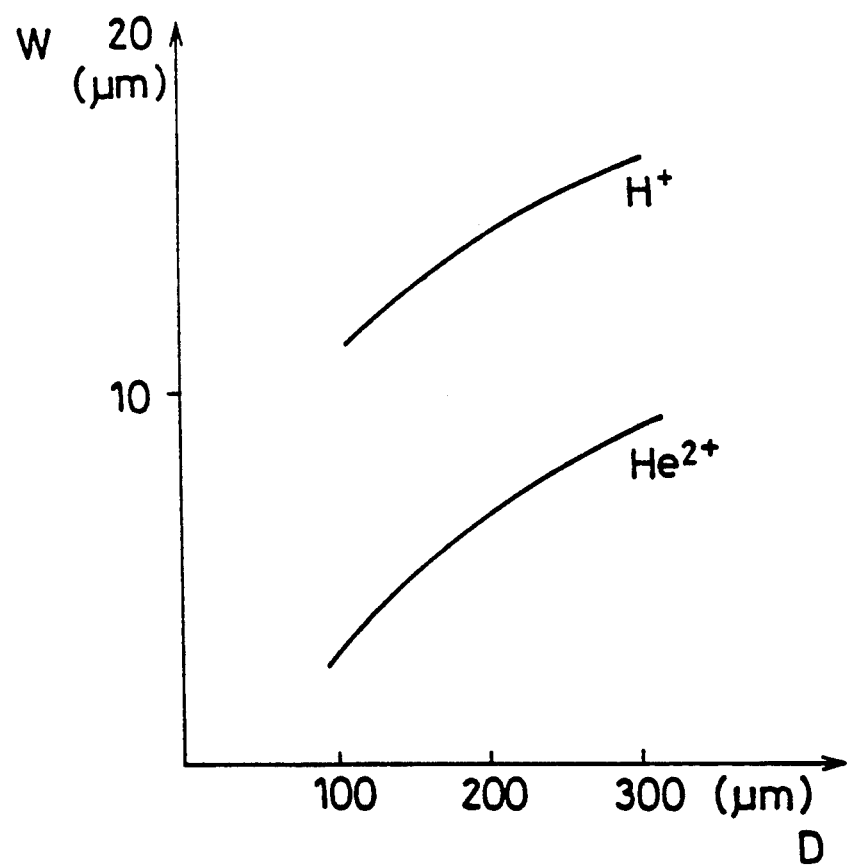

FIG. 16 is a graph showing the relations between the average range D and the defect distribution peak half-value width W with regard to hydrogen ions and helium ions in silicon. As stated above, in the ordinary IGBT 60, the P+ collector layer 1 is about 270 μm in thickness and the N+ epitaxial layer 2A is about 10 μm in thickness. Referring to FIG. 16, hydrogen ions are bombarded into silicon with the range of about 275 μm to make the defect distribution peak half-value width W of about 16 μm, and the bombardment of helium ions under the same condition results in the defect distribution peak half-value width W of about 9 μm. In order to cause crystal defects only in the N+ epitaxial layer 2A of the thickness of about 10 μm, not the hydrogen ions but the helium ions must be bombarded. If the N+ epitaxial layer 2A is thicker, the hydrogen ions can be used. Not shown in FIG. 16, an ion heavier than a helium ion can be applied instead of the helium ion because the defect distribution peak half-value width W caused by the bombardment is smaller than that caused by the helium ion bombardment.

Figure 17:
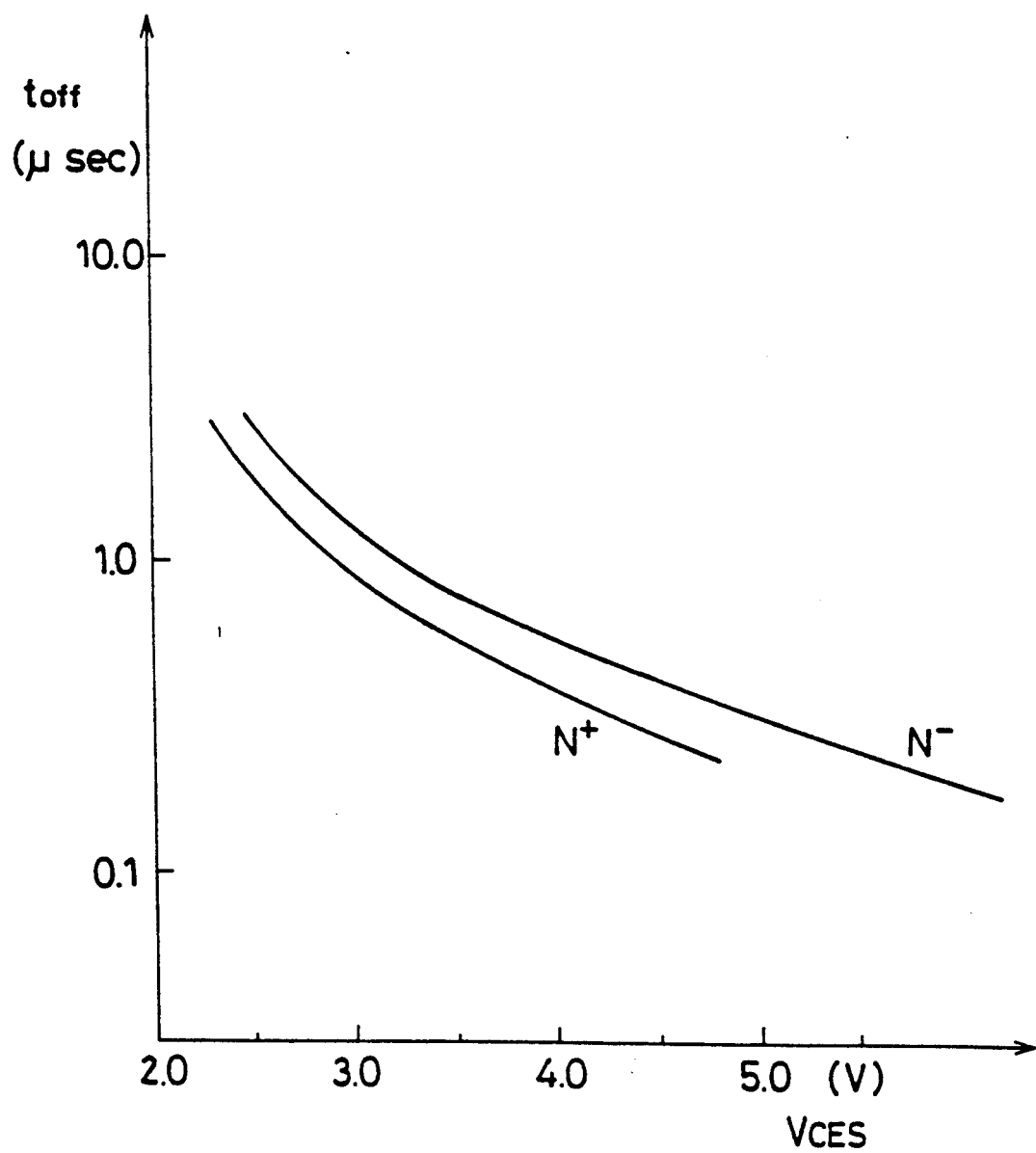

Table I shows the results of the measurement of the turn-off time $t_{off}$(psec) and the ON resistance $V_{CES}$(V) in the cases where after the helium ions are bombarded with the quantity changed, annealing treatment is carried out on a given condition (temperature: 300° C., atmosphere: N₂, time: 6 hours) to set the range near the center of the N+ epitaxial layer 2A and where the same steps are carried out to set the range near the center of the N− epitaxial layer 2B. FIG. 7 is a graph showing the trade-off relations between the turn-off time and the ON resistance based upon the Table 1 in both the cases. In FIG. 17, a curve marked with symbol N+ represents the trade-off relations between the turn-off time and the ON resistance in the case where the helium ions are bombarded into the vicinity of the center of the N+ epitaxial layer 2A, and a curve marked with symbol N− represents the trade-off relations between the turn-off time and the ON resistance in the case where the helium ions are bombarded into the N− epitaxial layer 2B.

TABLE 1

| Amount of Ion Bombardment (cm$^{-2}$) | $V_{CES}$ (V) | $t_{off}$(μsec) |
|---|---|---|
| In N− epitaxial layer 2B | | |
| 3 × 10¹⁰ | 2.52 | 2.48 |

TABLE 1-continued

| Amount of Ion Bombardment (cm$^{-2}$) | $V_{CES}$ (V) | $t_{off}$(μsec) |
|---|---|---|
| 3 × 10¹⁰ | 2.82 | 1.92 |
| 1 × 10¹¹ | 3.08 | 1.05 |
| 2 × 10¹¹ | 3.96 | 0.60 |
| 4 × 10¹¹ | 6.14 | 0.20 |
| In N+ epitaxial layer 2A | | |
| 3 × 10¹⁰ | 2.44 | 1.89 |
| 3 × 10¹⁰ | 2.81 | 1.16 |
| 1 × 10¹¹ | 3.17 | 0.75 |
| 2 × 10¹¹ | 4.11 | 0.37 |
| 4 × 10¹¹ | 9.13 | 0.18 |

As can be seen in FIG. 17, the trade-off relations between the turn-off time and the ON resistance are kept better in the case where the helium ions are bombarded into the N+ epitaxial layer 2A than in the case where they are bombarded into the N− epitaxial layer 2B. This is caused for the following reason: As shown in FIG. 12, the concentration of the N+ epitaxial layer 2A is sufficiently higher than that of the N− epitaxial layer 2B. This means that the resistance value of the N+ epitaxial layer 2A is sufficiently higher than that of the N− epitaxial layer 2B, and the increase in resistance component caused by the producing of the crystal defects can be ignored. Thus, although the conductivity modulation caused primarily in the N− epitaxial layer 2B when the IGBT is ON is somewhat impeded, the extent of the impediment can be reduced compared with the case where the crystal defects are caused directly in the N− epitaxial layer 2B.

Due to electrons flowing into the P+ collector layer 1 from the N base layer 2 at the beginning of the turn-off time, holes are liable to flow into the N base layer 2 from the P+ collector layer 1, and in order to rapidly catch the holes, it is convenient to cause the crystal defects collectively in the N+ epitaxial layer 2A in the closest proximity to the P+ collector layer 1. That goes similarly for the case where ions other than the helium ions, such as hydrogen ions and lithium ions, are bombarded.

Figure 18:
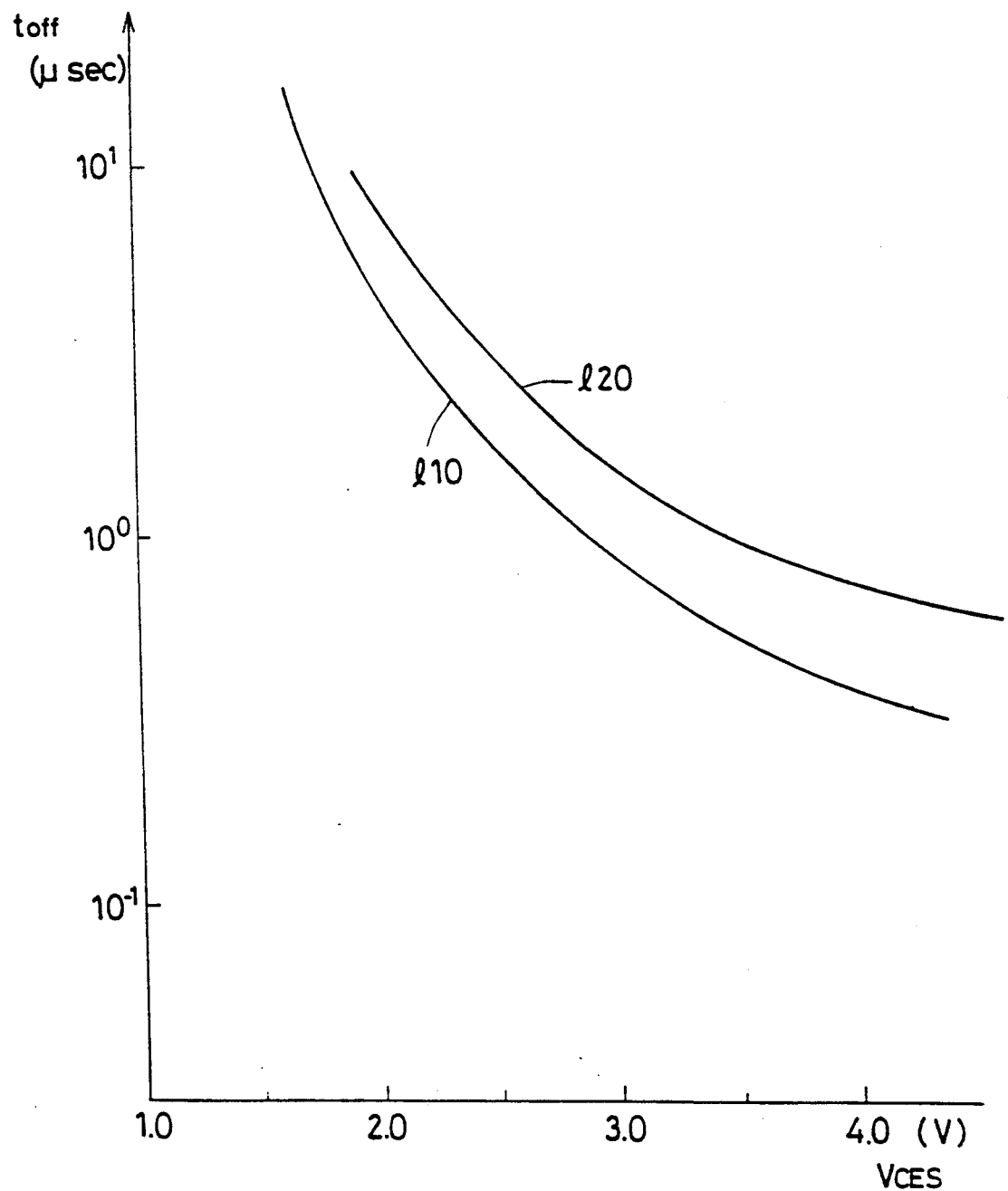

Table 2 shows the results of measurement of the turn-off time and the ON resistance of an IGBT of which N+ epitaxial layer 2A is 10 μm in thickness and another IGBT of which N+ epitaxial layer 2A is 20 μm in thickness in the case where after the helium ions are bombarded with the quantity changed to cause the crystal defects in those N+ epitaxial layers 2A, annealing treatment is carried out on a given condition (temperature: 300° C., atmosphere: N₂, time: 6 hours). FIG. 18 presents a graph showing the trade-off relations between the turn-off time and the ON resistance of both the IGBTs on the basis of Table 2. In FIG. 18, the measurement results are shown by a curve 110 for the IGBT having the N+ epitaxial layer 5A of 10 μm thick and by a curve 20 for the IGBT having the N+ epitaxial layer 2A of 20 μm thick.

TABLE 2

| Amount of Ion Bombardment (cm$^{-2}$) | $V_{CES}$ (V) | $t_{off}$(μsec) |
|---|---|---|
| N+ epitaxial layer 2A (10 μm) | | |
| 0 | 1.65 | 17.6 |
| 3 × 10¹⁰ | 2.44 | 1.89 |
| 3 × 10¹⁰ | 2.81 | 1.16 |
| 1 × 10¹¹ | 3.17 | 0.75 |
| 2 × 10¹¹ | 4.11 | 0.37 |
| In N+ epitaxial layer 2A (20 μm) | | |

TABLE 2-continued

| Amount of Ion Bombardment (cm$^{-2}$) | $V_{CES}$ (V) | $t_{off}$ (μsec) |
|---|---|---|
| 0 | 1.90 | 10.3 |
| 3 × 10$^{10}$ | 3.02 | 1.75 |
| 3 × 10$^{10}$ | 3.31 | 1.05 |
| 1 × 10$^{11}$ | 3.23 | 1.03 |
| 2 × 10$^{11}$ | 4.68 | 0.61 |

As shown in FIG. 18, when the helium ions are bombarded into the N+ epitaxial layer 2A under the same conditions, the IGBT having the N+ epitaxial layer 2A of 10 μm thick is improved in the trade-off relations between the turn-off time and the ON resistance compared to the IGBT having the N+ enitaxial layer 2A of 20 μm thick.

What causes this is that thicker the N+ epitaxial layer 2A is, lower the efficiency of holes flowing in from the P+ collector layer 1, and the thickness of the N+ epitaxial layer 2A influences the ON voltage in the IGBT before the ion bombardment. It is desirable that the N+ epitaxial layer 2A is thin to improve the efficiency of holes flowing in, but on the contrary, it is necessary to keep the N+ epitaxial layer 2A sufficiently thick because the crystal defects caused by the ion bombardment are locally produced in the N+ epitaxial layer 2A. Thus, the thickness of the N+ epitaxial layer 2A must be determined taking the above requirements into consideration.

Figure 19:
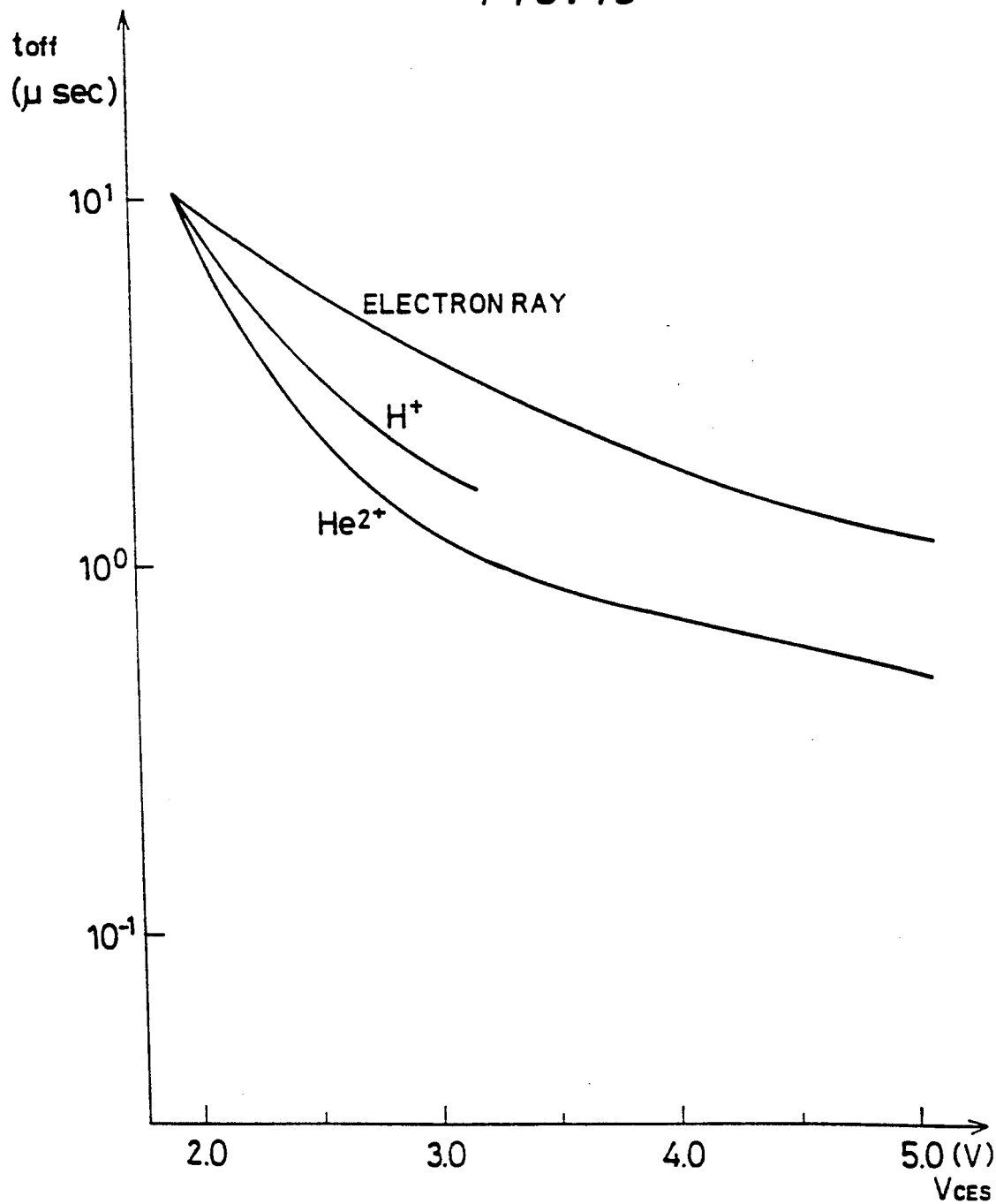

Table 3A to Table 3D show the results of measurement of the turn-off time and the ON resistance in the cases where after electron beams, the hydrogen ions or helium ions are directed to the IGBT having the N+ epitaxial layer 2A 20 μm thick (the hydrogen ions or the helium ions would be bombarded to have the range close to the center of the N+ epitaxial layer 2A) to cause the crystal defects in the N+ epitaxial layers 2A, annealing treatment is carried out on a given condition (temperature: 300° C., atmosphere: N$_2$, time: 6 hours). Table 3A shows the measurement results when nothing is done, and Table 3B, Table 3C and Table 3D show the measurement results when the electron beams, the hydrogen ions and the helium ions are directed, respectively. FIG. 19 is a graph showing the trade-off relations between the ON resistance and the turn-off time on the basis of Table 3A to Table 3D.

TABLE 3A

| Amount of Irradiation or Bombardment (cm$^{-2}$) | $V_{CES}$ (V) | $t_{off}$ (μsec) |
|---|---|---|
| 0 (no irradiation nor bombardment) | 1.90 | 10.3 |

TABLE 3B

| Amount of Ion Bombardment (cm$^{-2}$) | electron beams | |
|---|---|---|
| | $V_{CES}$ (V) | $t_{off}$ (μsec) |
| 4 × 10$^{13}$ | 2.69 | 5.84 |
| 4 × 10$^{14}$ | 3.19 | 3.30 |
| 1.4 × 10$^{14}$ | 3.61 | 2.52 |
| 1.6 × 10$^{14}$ | 3.76 | 2.36 |
| 2.0 × 10$^{14}$ | 3.89 | 1.96 |
| 3.0 × 10$^{14}$ | 4.68 | 1.36 |

TABLE 3C

| Amount of Ion Bombardment (cm$^{-2}$) | Hydrogen Ions | |
|---|---|---|
| | $V_{CES}$ (V) | $t_{off}$ (μsec) |
| 3 × 10$^{10}$ | 2.10 | 7.94 |

TABLE 3C-continued

| Amount of Ion Bombardment (cm$^{-2}$) | Hydrogen Ions | |
|---|---|---|
| | $V_{CES}$ (V) | $t_{off}$ (μsec) |
| 1 × 10$^{11}$ | 2.50 | 3.27 |
| 3 × 10$^{11}$ | 2.92 | 1.94 |

TABLE 3D

| Amount of Ion Bombardment (cm$^{-2}$) | He$^{2+}$ | |
|---|---|---|
| | $V_{CES}$ (V) | $t_{off}$ (μsec) |
| 3 × 10$^{10}$ | 2.57 | 2.29 |
| 6 × 10$^{10}$ | 3.02 | 1.06 |
| 1 × 10$^{11}$ | 3.43 | 0.95 |
| 2 × 10$^{11}$ | 4.81 | 0.58 |

As shown in FIG. 19, the trade-off relations between the ON resistance and the turn-off time of the IGBT is best in the helium ion bombardment, secondarily in the hydrogen ion bombardment and tertiarily in the electron beam irradiation. In the case of the electron beam irradiation, since the crystal defects are caused in the entire IGBT, the trade-off relations are not so good. The helium ion bombardment results in better trade-off relations than the hydrogen ion bombardment because they may cause crystal defects distributed in different ranges (they are in proportion to the defect distribution peak half-value width W). For example, in the IGBT to which the hydrogen ions to cause the crystal defects in a comparatively large range are bombarded, the crystal defects are caused not only in the N+ epitaxial layer 2A but in the N− epitaxial layer 2B, though not so many. On the other hand, in the IGBT to which the helium ions to cause the crystal defects in a comparatively narrow range are bombarded, the crystal defects are caused certainly in the N+ epitaxial layer 2A alone. Consequently, The trade-off relations between the ON resistance and the turn-off time in the IGBT to which the hydrogen ions have been bombarded may be worse than in the IGBT to which the helium ions have been bombarded. Though not shown in FIG. 19, ions which are heavier and produce a narrower crystal defect distribution than the helium ions, such as lithium ions, give an effect equivalent to that given by the helium ions.

Figure 20:
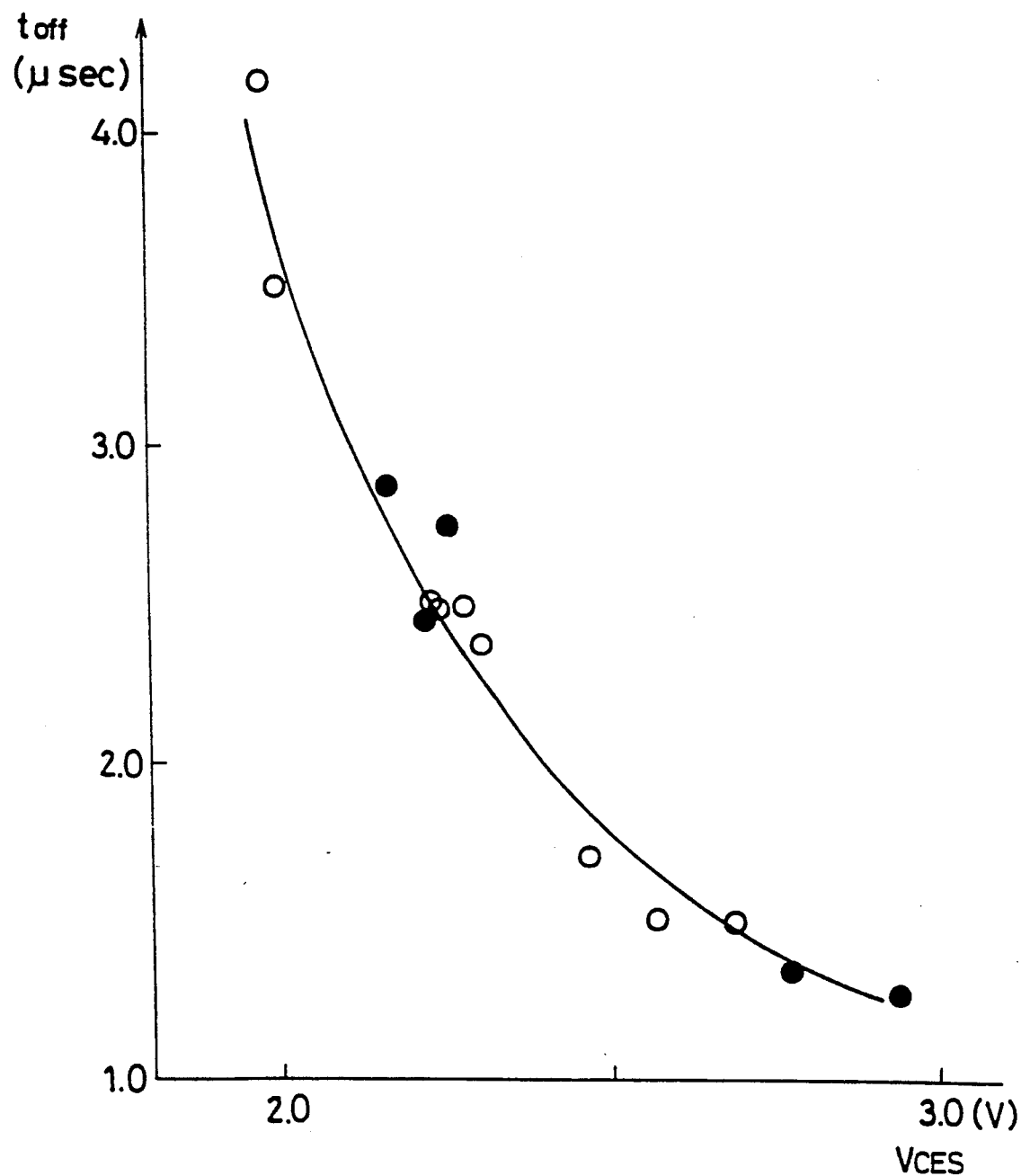

Table 4 shows the results of measurement of the turn-off time and the ON resistance of two IGBTs which are different from each other in the defect distribution peak half-value width W because devices in the IGBTs are different in thickness from each other (as a result, different in the distance from the surface to the vicinity of the center of the N+ epitaxial layer 2A) in the case where the helium ions are bombarded into the N+ epitaxial layers 2A of 10 μm thick in those IGBTs with the bombardment quantity changed. In the experiments, annealing treatment is always carried out in N$_2$ atmosphere at 300° C. for five hours. FIG. 20 is a graph showing the trade-off relations between the turn-off time and the ON resistance on the basis of Table 4.

TABLE 4

| Thickness of Device (μm) | 400 | | 230 | |
|---|---|---|---|---|
| Ion Bombarded Face | P+ Collector Layer 1 | | | |
| Calculated Defect Distribution Peak Half-Value Width W (μm) | 8.8 | | 3.5 | |
| Amount of Ion (He$^{2+}$) Bombardment (cm$^{-2}$) | $t_{off}$ | $V_{CES}$ | $t_{off}$ | $V_{CES}$ |
| | 2.43 | 2.23 | 3.50 | 1.99 |
| 3 × 10$^{10}$ | 2.73 | 2.26 | 4.15 | 1.95 |

TABLE 4-continued

|  | 2.86 | 2.17 | 2.50 | 2.23 |
|---|---|---|---|---|
|  | 1.34 | 2.78 | 2.47 | 2.24 |
| 6 × 10¹⁰ | 1.27 | 2.90 | 2.24 | 2.28 |
|  |  |  | 2.81 | 2.31 |
|  | 0.68 | 7.20 | 1.51 | 2.57 |
| 1 × 10¹¹ |  |  | 1.70 | 2.47 |
|  |  |  | 1.51 | 2.69 |

When the helium ions are bombarded into the N+ epitaxial layer 2A formed in each of an IGBT of which device is 400 μm in thickness (marked by ● in FIG. 20) and an IGBT of which device is 230 μm in thickness (marked by ○ in the figure) those IGBTs are different from each other in the defect distribution because they are different in the defect distribution peak half-value width W (8.8 μm and 3.5 μm as shown in Table 4), as can be seen in FIG. 16. However, as shown in FIG. 20, there is almost no difference between them in the trade-off relations between the turn-off time and the ON resistance. The reason for this is that the crystal defects are caused in the N+ epitaxial layer 2A alone in the IGBTs. In other words, when the crystal defects are caused in the N+ epitaxial layer 2A alone, the trade-off relations between the turn-off time and the ON resistance are not changed, no matter what the device thickness may be.

The above discussion can be concluded as follows:

(1) Use of heavy ions is practically restricted from an aspect of acceleration energy. (FIG. 14)

(2) Heavier the ions are, narrower the crystal defect distribution. (FIG. 16)

(3) The trade-off relations between the turn-off time and the ON resistance are more improved when the light ions ray 50 is irradiated into the N+ epitaxial layer 2A than when it is irradiated into the N− epitaxial layer 2B. (FIG. 17)

(4) The above-mentioned trade-off relations get less improved as the, N+ epitaxial layer 2A increases in thickness. (FIG. 18)

(5) The above-mentioned trade-off relations are best improved when the crystal defects are caused in the N+ epitaxial layer 2A alone. (FIG. 19)

(6) The above-mentioned trade-off relations are not changed even when the crystal defect distribution gets narrower in the N+ epitaxial layer 2A. (FIG. 20)

Taking the above (2), (3), (4), (5) and (6) are into consideration, it is desirable that helium ion and ions heavier than that is bombarded so that its range reaches the vicinity of the center of the N+ epitaxial layer 2A in general IGBTs of which P+ collector layer 1 is about 270 μm in thickness and of which N+ epitaxial layer 2A is about 10 μm in thickness. In this case, however, the restriction of (1) must be allowed for with regard to the ion heavier than the helium ion. When the N+ epitaxial layer 2A is considerably thick, a hydrogen ion can be used. In such a case, however, the disadvantage shown in (4) arises.

The IGBT of the fifth embodiment is manufactured without directing ionizing radiation to the gate insulating film 5 at all, and hence there is no change in the threshold voltage before and after the lifetime control.

If the helium ion bombardment according to the fifth embodiment is applied to the irradiation of the high energy light ion beam 41b n the third embodiment, the controllability of the lifetime control can be further improved in the third embodiment.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A method of manufacturing an insulated gate bipolar transistor, comprising the steps of:
    (a) preparing a first semiconductor layer of a first conductivity type having first and second major surfaces;
    (b) forming a second semiconductor layer of a second conductivity type on said first major surface of said first semiconductor layer;
    (c) selectively forming a first semiconductor region of the first conductivity type on a surface of said second semiconductor layer;
    (d) selectively forming a second semiconductor region of the second conductivity type on a surface of said first semiconductor region;
    (e) forming an insulating film on the surface of said first semiconductor region between said second semiconductor layer and said second semiconductor region;
    (f) forming a control electrode on said insulating film;
    (g) forming a first main electrode lying over said first and second semiconductor regions;
    (h) forming a second main electrode on said second major surface of said first semiconductor layer, and
    (i) irradiating an ionizing radiation from an upper side of said control electrode with a given voltage being applied between said control electrode and said first main electrode.

2. A method of manufacturing an insulated gate bipolar transistor in accordance with claim 1, wherein said given voltage in said step (i) includes a negative voltage.

3. A method of manufacturing an insulated gate bipolar transistor in accordance with claim 1, wherein said first semiconductor region has a high impurity concentration, and said given voltage in said step (i) includes a positive voltage.

4. A method of manufacturing an insulated gate bipolar transistor in accordance with claim 1, further comprising the step of
    forming a third semiconductor layer of the second conductivity type in said first semiconductor layer, penetrating said first semiconductor layer.

5. A method of manufacturing an insulated gate bipolar transistor, comprising the steps of:
    (a) preparing a first semiconductor layer of a first conductivity type having first and second major surfaces;
    (b) forming a second semiconductor layer of a second conductivity type on said first major surface of said first semiconductor layer;
    (c) selectively forming a first semiconductor region of the first conductivity type on a surface of said second semiconductor layer;
    (d) selectively forming a second semiconductor region of the second conductivity type on a surface of said first semiconductor region;
    (e) forming an insulating film on the surface of said first semiconductor region between said second semiconductor layer and said second semiconductor region;
    (f) forming a control electrode on said insulating film;

(g) forming a first main electrode lying over said first and second semiconductor regions;

(h) forming a second main electrode on said second major surface of said first semiconductor layer;

(i) irradiating a first ionizing radiation from an upper side of said control electrode with a given voltage being applied between said control electrode and said first main electrode so that a range of said first ionizing radiation comes close to said insulating film; and (j) irradiating a second ionizing radiation from a side of said second main electrode, so that a range of said second ionizing radiation exists in said second semiconductor layer.

6. A method of manufacturing an insulated gate bipolar transistor in accordance with claim 5, wherein
said first semiconductor region has a high impurity concentration, and
said given voltage in said step (i) includes a positive voltage.

* * * * *